(12) United States Patent
Wang

(10) Patent No.: US 12,113,504 B2
(45) Date of Patent: Oct. 8, 2024

(54) METHOD OF MANUFACTURING BULK ACOUSTIC WAVE RESONATOR

(71) Applicant: Newsonic Technologies, Guangdong (CN)

(72) Inventor: Jian Wang, Guangdong (CN)

(73) Assignee: Newsonic Technologies, Shenzhen (CN)

( * ) Notice: Subject to any disclaimer, the term of this patent is extended or adjusted under 35 U.S.C. 154(b) by 26 days.

(21) Appl. No.: 18/194,130

(22) Filed: Mar. 31, 2023

(65) Prior Publication Data

US 2023/0353114 A1    Nov. 2, 2023

Related U.S. Application Data

(62) Division of application No. 17/899,186, filed on Aug. 30, 2022, now Pat. No. 11,652,460.

(30) Foreign Application Priority Data

Apr. 28, 2022   (CN) .......................... 202210454622.6

(51) Int. Cl.
   *H03H 3/02*       (2006.01)
(52) U.S. Cl.
   CPC .................................. *H03H 3/02* (2013.01)
(58) Field of Classification Search
   CPC .............. H03H 3/02; H03H 2003/021; H03H 2003/022; H03H 2003/023;
   (Continued)

(56) References Cited

U.S. PATENT DOCUMENTS

| | | | |
|---|---|---|---|
| 11,652,460 B2 * | 5/2023 | Wang ....................... | H03H 3/02 29/25.35 |
| 11,689,171 B2 * | 6/2023 | Weng ....................... | H03H 3/02 29/594 |

(Continued)

FOREIGN PATENT DOCUMENTS

| | | |
|---|---|---|
| CN | 108493326 A | 9/2018 |
| CN | 113572446 A | 10/2021 |

OTHER PUBLICATIONS

Notice of Allowance for related U.S. Appl. No. 17/899,186, dated Apr. 19, 2023.

*Primary Examiner* — Jeffrey T Carley
*Assistant Examiner* — Joshua D Anderson
(74) *Attorney, Agent, or Firm* — Leason Ellis LLP

(57) ABSTRACT

Provided is a method of manufacturing a bulk acoustic wave resonator, which includes: providing a piezoelectric substrate for forming a piezoelectric layer; forming a first electrode structure on the portion of the piezoelectric substrate for forming the piezoelectric layer; forming a dielectric layer on the first electrode structure, and performing a patterning process on the dielectric layer to form a patterned dielectric layer comprising a sacrificial dielectric part and a periphery dielectric part; forming a boundary layer on the patterned dielectric layer, the boundary layer covering a surface of the patterned dielectric layer and surrounding the sacrificial dielectric part; thinning the piezoelectric substrate to form the piezoelectric layer, the first electrode structure being located at a first side of the piezoelectric layer; forming a second electrode structure on a second side of the piezoelectric layer; and removing the sacrificial dielectric part to form a resonant cavity.

20 Claims, 42 Drawing Sheets

(58) Field of Classification Search
CPC .... H03H 9/02118; H03H 9/171; H03H 9/173; H10N 30/063; H10N 30/072; H10N 30/073; H10N 30/08; H10N 30/082; H10N 30/085; H10N 30/086; Y10T 29/42; Y10T 29/49005
See application file for complete search history.

(56) References Cited

U.S. PATENT DOCUMENTS

| | | |
|---|---|---|
| 2010/0052472 A1 | 3/2010 | Nishino et al. |
| 2010/0107388 A1 | 5/2010 | Iwamoto |
| 2010/0112233 A1 | 5/2010 | Iwamoto et al. |
| 2011/0132866 A1 | 6/2011 | Pijolat |
| 2011/0278993 A1 | 11/2011 | Iwamoto |
| 2012/0073099 A1 | 3/2012 | Iwamoto |
| 2012/0205754 A1 | 8/2012 | Iwamoto |
| 2014/0167565 A1 | 6/2014 | Iwamoto |
| 2014/0167566 A1 | 6/2014 | Kando |
| 2014/0175945 A1 | 6/2014 | Kando |
| 2014/0175949 A1 | 6/2014 | Kando |
| 2015/0028720 A1 | 1/2015 | Kando |
| 2017/0098754 A1 | 4/2017 | Iwamoto |
| 2017/0309428 A1* | 10/2017 | Hashimoto ............ H01H 33/64 |
| 2018/0048281 A1* | 2/2018 | Lee .................... H03H 9/02102 |
| 2018/0351533 A1* | 12/2018 | Lee .................... H03H 9/02086 |
| 2020/0176666 A1* | 6/2020 | Lee .................... H03H 9/02086 |
| 2020/0259070 A1* | 8/2020 | Moe .................... H10N 30/079 |
| 2021/0091742 A1 | 3/2021 | Gorisse et al. |
| 2022/0103147 A1 | 3/2022 | Wang |
| 2022/0166398 A1 | 5/2022 | Bousquet et al. |

\* cited by examiner

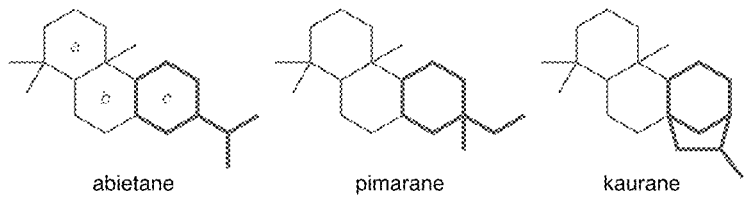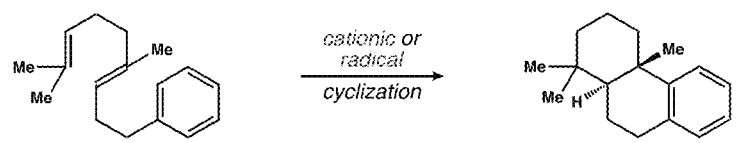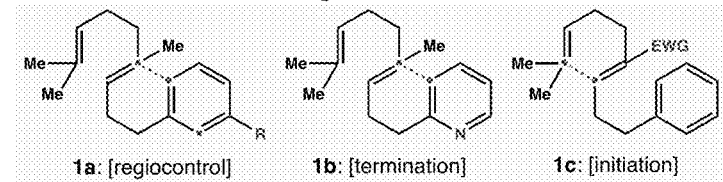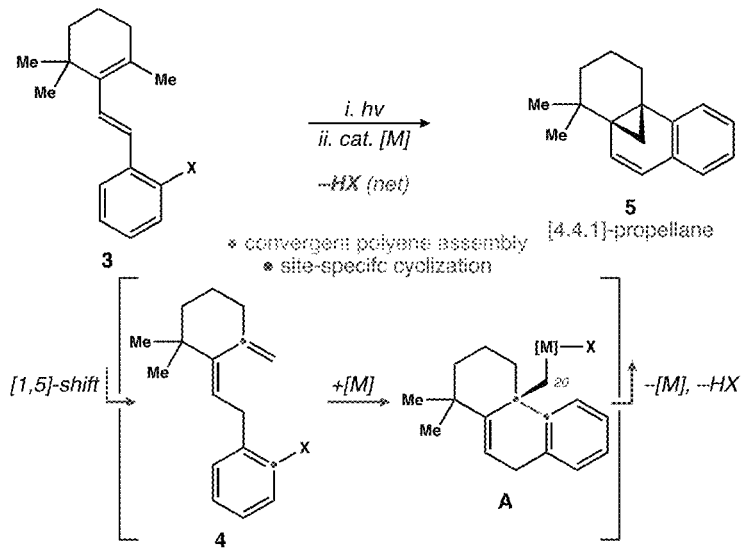
FIG. 1

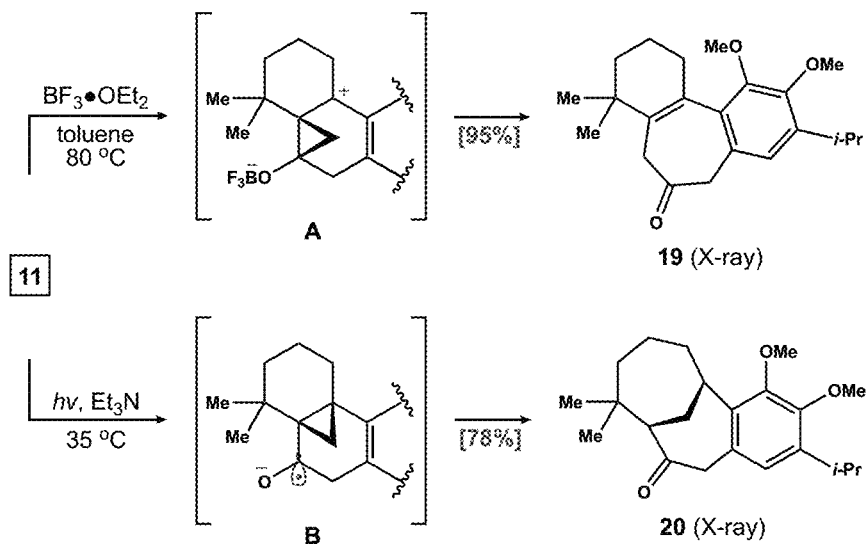
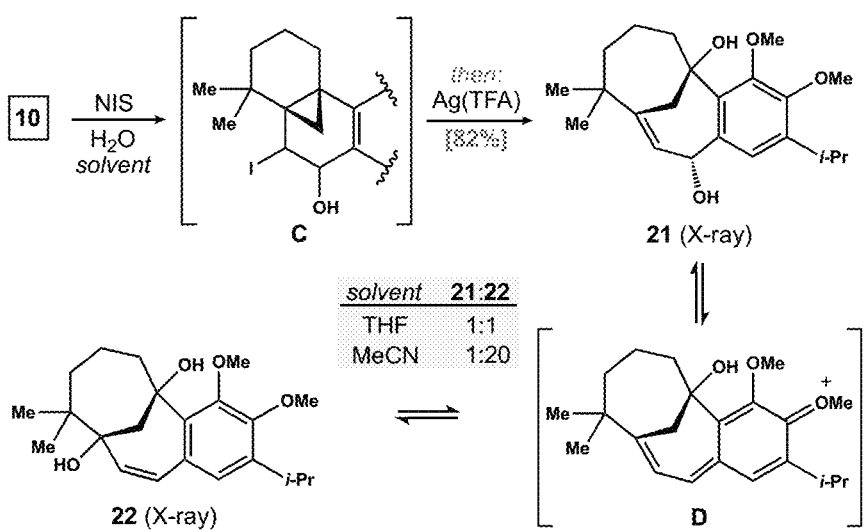
FIG. 5

METHOD OF MANUFACTURING BULK ACOUSTIC WAVE RESONATOR

CROSS-REFERENCE TO RELATED APPLICATION

This application is a divisional application of and claims priority to a prior application U.S. Ser. No. 17/899,186, filed on Aug. 30, 2022, which claims priority to the Chinese patent application No. 202210454622.6, filed on Apr. 28, 2022, the entire disclosure of which are incorporated herein by reference as part of the present application.

TECHNICAL FIELD

The embodiments of the present invention relate to a method of manufacturing a bulk acoustic wave resonator.

BACKGROUND

At present, for some conventional film bulk acoustic resonator (FBAR) structures, a piezoelectric layer having piezoelectric property is generally formed on a substrate by a process, such as physical vapor deposition (PVD) or chemical vapor deposition (CVD), but lithium niobate crystal or lithium tantalate crystal having piezoelectric property cannot be deposited on the substrate of bulk acoustic wave resonator by the process such as PVD or CVD. Therefore, traditional deposition methods cannot be used to form a piezoelectric layer constituted by lithium niobate crystal or lithium tantalate crystal having piezoelectric property for a bulk acoustic wave resonator.

SUMMARY

At least one embodiment of the disclosure provides a method of manufacturing a bulk acoustic wave resonator, which comprises: providing a piezoelectric substrate; performing an ion implantation process on the piezoelectric substrate to define a cleavage plane in the piezoelectric substrate, and the piezoelectric substrate comprises a first portion and a second portion located on opposite sides of the cleavage plane, the first portion is used for forming a piezoelectric layer; forming a first electrode structure on the first portion of the piezoelectric substrate; forming a dielectric layer on the first electrode structure, and performing a patterning process on the dielectric layer to form a patterned dielectric layer comprising a sacrificial dielectric part and a periphery dielectric part; forming a boundary layer on the patterned dielectric layer, the boundary layer covering a surface of the patterned dielectric layer and surrounding the sacrificial dielectric part; performing an annealing process on the piezoelectric substrate to split the piezoelectric substrate along the cleavage plane, and remove the second portion of the piezoelectric substrate, and expose the first portion used for the piezoelectric layer, wherein the first electrode structure is located on a first side of the piezoelectric layer; forming a second electrode structure on a second side of the piezoelectric layer opposite the first side; and removing the sacrificial dielectric part, so as to form a resonant cavity between the boundary layer and the piezoelectric layer and between the boundary layer and the first electrode structure.

In the method of manufacturing the bulk acoustic wave resonator provided by at least one embodiment, the ion implantation process comprises implanting hydrogen ions or helium ions into the piezoelectric substrate.

In the method of manufacturing the bulk acoustic wave resonator provided by at least one embodiment, performing the patterning process on the dielectric layer and forming the boundary layer on the patterned dielectric layer comprises: removing a portion of the dielectric layer to form a trench in the dielectric layer, the trench separates the sacrificial dielectric part apart from the periphery dielectric part, and the trench surrounds the sacrificial dielectric part; and forming the boundary layer, the boundary layer fills into the trench and lines a surface of the trench, and is formed on a side of the sacrificial dielectric part away from the piezoelectric layer.

In the method of manufacturing the bulk acoustic wave resonator provided by at least one embodiment, before performing the annealing process on the piezoelectric substrate, the method further comprises: forming a bonding layer on the boundary layer, the bonding layer fills a portion of the trench not filled by the boundary layer and is formed on a side of the patterned dielectric layer away from the piezoelectric layer; and bonding a carrier substrate on a side of the bonding layer away from the boundary layer, wherein, in the bulk acoustic wave resonator, the bonding layer and the boundary layer comprise protrusion parts protruding away from the carrier substrate and toward the piezoelectric layer in a direction perpendicular to a top surface of the carrier substrate, and the protrusion parts of the bonding layer and the boundary layer are located between the resonant cavity and the periphery dielectric part in the direction parallel to the top surface of the carrier substrate, and surrounds the resonant cavity.

In the method of manufacturing the bulk acoustic wave resonator provided by at least one embodiment, after removing the second portion of the piezoelectric substrate, the method further comprises performing a planarization process on the first portion of the piezoelectric substrate to form the piezoelectric layer; wherein, after the piezoelectric substrate is split along the cleavage plane by performing the annealing process on the piezoelectric substrate, a surface layer of the first portion comprises residual implantation ions, and the surface layer is removed during the planarization process.

In the method of manufacturing the bulk acoustic wave resonator provided by at least one embodiment, removing the sacrificial dielectric part to form the resonant cavity comprises: performing a patterning process on the piezoelectric layer from the second side of the piezoelectric layer to remove a portion of the piezoelectric layer, and form a release hole penetrating through the piezoelectric layer and exposing the sacrificial dielectric part; and performing an etching process on the sacrificial dielectric part, wherein an etchant used in the etching process enters a region where the sacrificial dielectric part is located through the release hole.

In the method of manufacturing the bulk acoustic wave resonator provided by at least one embodiment, forming the first electrode structure comprises: forming a first electrode, an intermediate dielectric layer, a sacrificial layer and an edge protrusion structure, the intermediate dielectric layer is located on a side of the first electrode away from the piezoelectric layer, and the edge protrusion structure is disposed on edges of the intermediate dielectric layer and the first electrode and is on a side of the intermediate dielectric layer away from the piezoelectric layer, the sacrificial layer is sandwiched between the edge protrusion structure and the intermediate dielectric layer; wherein an etching process for removing the sacrificial dielectric part further removes the sacrificial layer, and a void is formed between the edge protrusion structure and the intermediate dielectric layer in the first electrode structure, and the void is in spatial communication with the resonant cavity.

In the method of manufacturing the bulk acoustic wave resonator provided by at least one embodiment, forming the second electrode structure comprises: forming a second electrode and a passivation layer on the second electrode, wherein the first electrode of the first electrode structure comprises a first electrode lead-out part connected to an external connector, and a sidewall of the second electrode structure adjacent to the first electrode lead-out part is aligned with an inner edge of the edge protrusion structure of the first electrode structure.

The method of manufacturing the bulk acoustic wave resonator provided by at least one embodiment further comprises: performing a patterning process on the piezoelectric layer to form a via hole extending through the piezoelectric layer and exposing a first electrode of the first electrode structure; and forming a connector passing through the via hole to be electrically connected to the first electrode.

In the method of manufacturing the bulk acoustic wave resonator provided by at least one embodiment, during the patterning process performed on the piezoelectric layer, the method further comprises: simultaneously forming a release hole extending through the piezoelectric layer and exposing the sacrificial dielectric part.

In the method of manufacturing the bulk acoustic wave resonator provided by at least one embodiment, the piezoelectric substrate is formed by a crystal pulling process.

In the method of manufacturing the bulk acoustic wave resonator provided by at least one embodiment, the piezoelectric substrate is a single crystal piezoelectric substrate.

In the method of manufacturing the bulk acoustic wave resonator provided by at least one embodiment, the piezoelectric substrate has a thickness ranging from 200 μm to 400 μm.

In the method of manufacturing the bulk acoustic wave resonator provided by at least one embodiment, the piezoelectric substrate comprises lithium niobate crystal and/or lithium tantalate crystal.

At least one embodiment of the disclosure provides a method of manufacturing a bulk acoustic wave resonator, comprising: providing a first substrate and a piezoelectric substrate; bonding the piezoelectric substrate to the first substrate through a bonding layer; performing a thinning process on the piezoelectric substrate to form a piezoelectric layer having a desired thickness, thereby forming a piezoelectric substrate structure comprising the piezoelectric layer and the first substrate bonded to each other; forming a first electrode structure on the piezoelectric layer of the piezoelectric substrate structure, the first electrode structure is located on a first side of the piezoelectric layer away from the first substrate; forming a dielectric layer on the first electrode structure, and performing a patterning process on the dielectric layer to form a patterned dielectric layer comprising a sacrificial dielectric part and a periphery dielectric part; forming a boundary layer on the patterned dielectric layer, the boundary layer covers a surface of the patterned dielectric layer and surrounds the sacrificial dielectric part; removing the first substrate and the bonding layer to expose a second side of the piezoelectric layer, the second side is opposite to the first side; forming a second electrode structure on the second side of the piezoelectric layer; and removing the sacrificial dielectric part to form a resonant cavity between the boundary layer and the piezoelectric layer and between the boundary layer and the first electrode structure.

In the method of manufacturing the bulk acoustic wave resonator provided by at least one embodiment, the first substrate is a semiconductor substrate, and the bonding layer is an insulating layer.

In the method of manufacturing the bulk acoustic wave resonator provided by at least one embodiment, bonding the piezoelectric substrate to the first substrate through the bonding layer comprises: forming a first bonding insulating layer on the first substrate; forming a second bonding insulating layer on the piezoelectric substrate; and performing a bonding process, such that the first bonding insulating layer on the first substrate and the second bonding insulating layer on the piezoelectric substrate are bonded together to form the bonding layer.

In the method of manufacturing the bulk acoustic wave resonator provided by at least one embodiment, performing the thinning process on the piezoelectric substrate comprises: performing a grinding process on the piezoelectric substrate from a side of the piezoelectric substrate away from the first substrate to remove a portion of the piezoelectric substrate.

The method of manufacturing the bulk acoustic wave resonator provided by at least one embodiment further comprises: performing an ion implantation process on the piezoelectric substrate to define a cleavage plane in the piezoelectric substrate, wherein performing the thinning process comprises: performing an annealing process on the piezoelectric substrate, such that the piezoelectric substrate is split along the cleavage plane; and performing a planarizing process on a remaining portion of the piezoelectric substrate adjacent to the bonding layer to form the piezoelectric layer.

In the method of manufacturing the bulk acoustic wave resonator provided by at least one embodiment, removing the first substrate and the bonding layer comprises performing a grinding process to remove the first substrate, and performing a grinding process and/or an etching process to remove the bonding layer.

In the method of manufacturing the bulk acoustic wave resonator provided by at least one embodiment, the first substrate comprises a glass carrier or a ceramic carrier having a release layer, and the bonding layer comprises at least one of an adhesive layer and a dielectric material layer, and the thinning process comprises a grinding process.

In the method of manufacturing the bulk acoustic wave resonator provided by at least one embodiment, removing the first substrate and the bonding layer comprises: irradiating a light on the release layer, such that the release layer is decomposed upon being irradiated by the light, and the first substrate is released from the piezoelectric layer; and performing at least one of a cleaning process and an etching process to remove the bonding layer.

In the method of manufacturing the bulk acoustic wave resonator provided by at least one embodiment, before removing the first substrate and the bonding layer, the method further comprises: forming a bonding layer on the boundary layer, and bonding the second substrate on the bonding layer.

In the method of manufacturing the bulk acoustic wave resonator provided by at least one embodiment, the piezoelectric substrate is formed by a crystal pulling process.

In the method of manufacturing the bulk acoustic wave resonator provided by at least one embodiment, the piezoelectric substrate is a single crystal piezoelectric substrate.

In the method of manufacturing the bulk acoustic wave resonator provided by at least one embodiment, the piezoelectric substrate has a thickness ranging from 200 μm to 400 μm.

In the method of manufacturing the bulk acoustic wave resonator provided by at least one embodiment, the piezoelectric substrate comprises lithium niobate crystal and/or lithium tantalate crystal.

BRIEF DESCRIPTION OF THE DRAWINGS

In order to more clearly illustrate the technical schemes of the embodiments of the present disclosure, the accompanying drawings of the embodiments will be briefly introduced as below. It is obvious that the accompanying drawings in the following description merely relate to some embodiments of the present disclosure, and are not intended to limit the present disclosure. It should be noted that, according to the standard practice in the industry, various features are not drawn to scale. In fact, the dimensions of the various features may be arbitrarily increased or reduced for clarity of discussion.

DETAILED DESCRIPTION

Figure 1A:
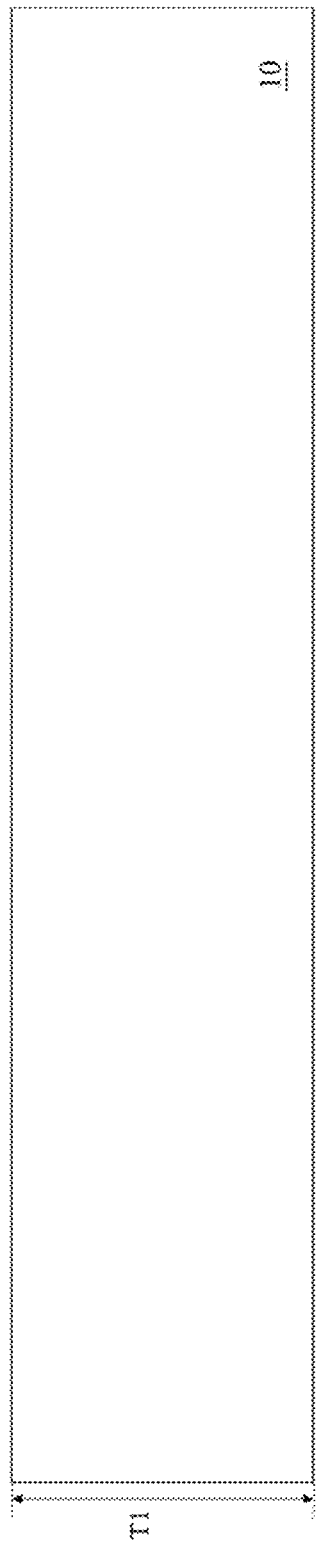
FIG. 1A to FIG. 1X are schematic cross-sectional views illustrating various stages in a manufacturing method of a bulk acoustic wave resonator according to some embodiments of the present disclosure.

In order to make the purpose, technical solutions and advantages of the embodiments of the present disclosure more clear, the technical solutions of the embodiments of the present disclosure will be clearly and completely described below with reference to the accompanying drawings of the embodiments of the present disclosure. Obviously, the described embodiments are some, but not all, embodiments of the present disclosure. Based on the described embodiments of the present disclosure, all other embodiments obtained by those of ordinary skill in the art without creative efforts fall within the protection scope of the present disclosure.

Unless otherwise defined, the technical terms or scientific terms used in the present disclosure should have the general meaning that is understood by those having ordinary skills in the art to which the present disclosure belongs. The terms "first", "second" and the like used in the present disclosure do not represent any order, quantity or importance, but are merely used to distinguish different components. The terms such as "including" or "comprising" or the like indicate that the elements or objects appearing therebefore include the elements or objects listed thereafter and their equivalents, but do not exclude other elements or objects. The terms, such as "connection" or "connected to each other" or the like do not limit that the connection is a physical or mechanical connection, but may include electrical connection, whether direct or indirect.

In the embodiments of the present disclosure, the orientation or positional relationships indicated by the terms "on", "below", "inside", "middle", "outside", "front", "back", etc. are based on the orientation or positional relationships shown in the drawings. These terms are primarily used to better describe the embodiments of the present disclosure and are not intended to limit that the indicated device, element, or component must have a particular orientation, or be formed and operated in a particular orientation. In addition to the orientation depicted in the figures, the spatially relative terms are intended to include different orientations of the device in use or operation. The device may be otherwise oriented (rotated 90 degrees or at other orientations) and the spatially relative terms used herein are to be interpreted accordingly. In addition, some of the above-mentioned terms may be used to express other meanings besides orientation or positional relationships. For example, the term "on" may also be used to indicate a certain attachment or connection relationship in some cases. For those having ordinary skill in the art, the specific meanings of these terms in the embodiments of the present disclosure can be understood according to specific situations.

In the manufacturing method of the bulk acoustic wave resonator according to various embodiments of the present disclosure, a piezoelectric layer for the bulk acoustic wave resonator is formed using a piezoelectric substrate, which is, for example, a single crystal piezoelectric wafer formed by a manufacturing process including a crystal pulling step, and the material of the piezoelectric substrate may include lithium niobate crystal, lithium tantalate crystal, or the like that has piezoelectric property. In this way, using the traditional deposition process to form the piezoelectric layer of the resonator can be avoided, and in the embodiments of the present disclosure, the piezoelectric layer of the resonator formed from a piezoelectric wafer can use lithium niobate crystal or lithium tantalate crystal as the piezoelectric material, which has good piezoelectric property, thereby improving the bandwidth of the bulk acoustic wave resonator.

Figure 1B:
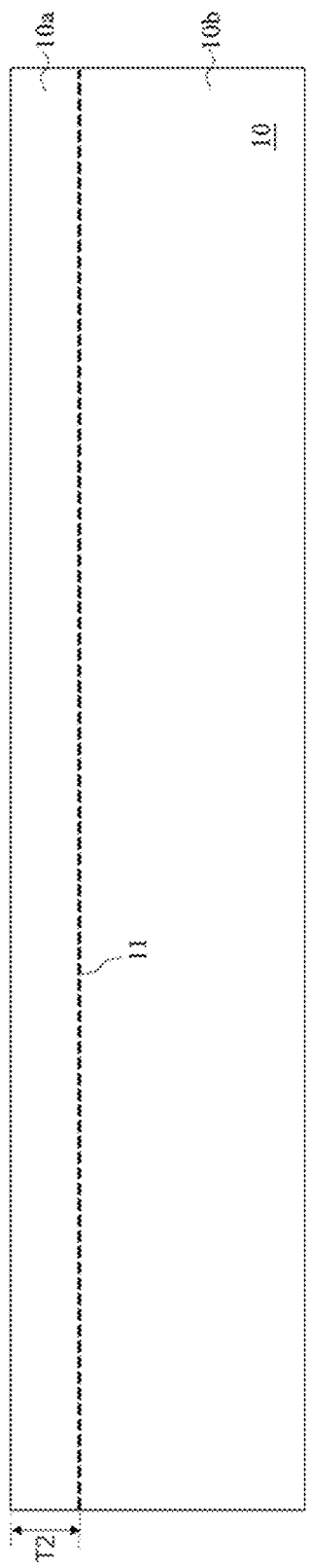
FIG. 1Y is a schematic cross-sectional view illustrating a bulk acoustic wave resonator according to some embodiments of the present disclosure.
Figure 1C:
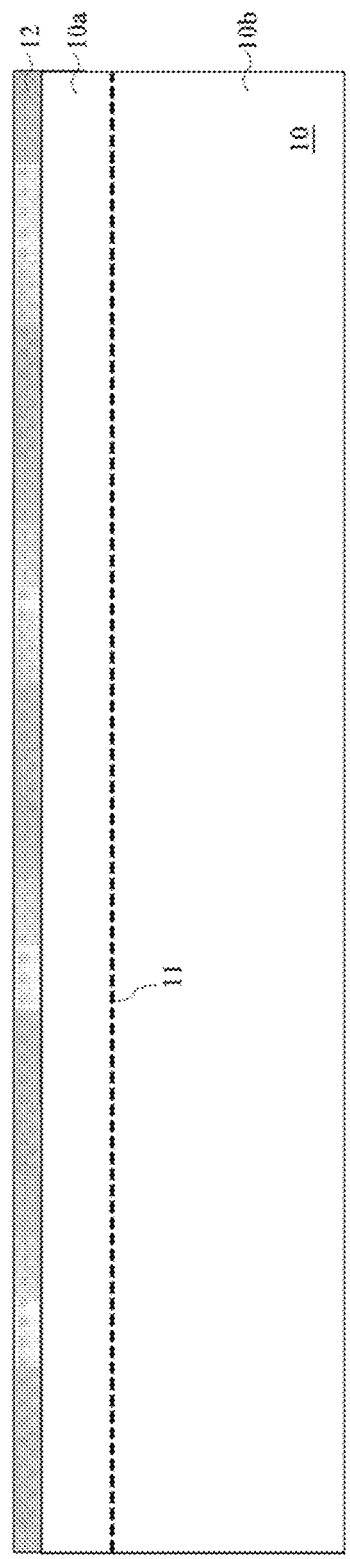
Figure 1D:
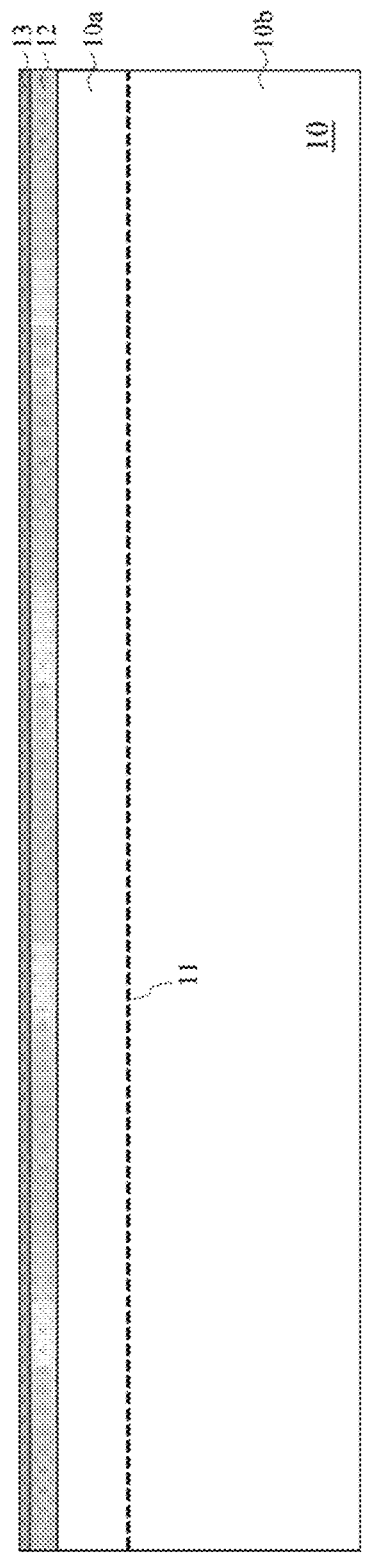
Figure 1E:
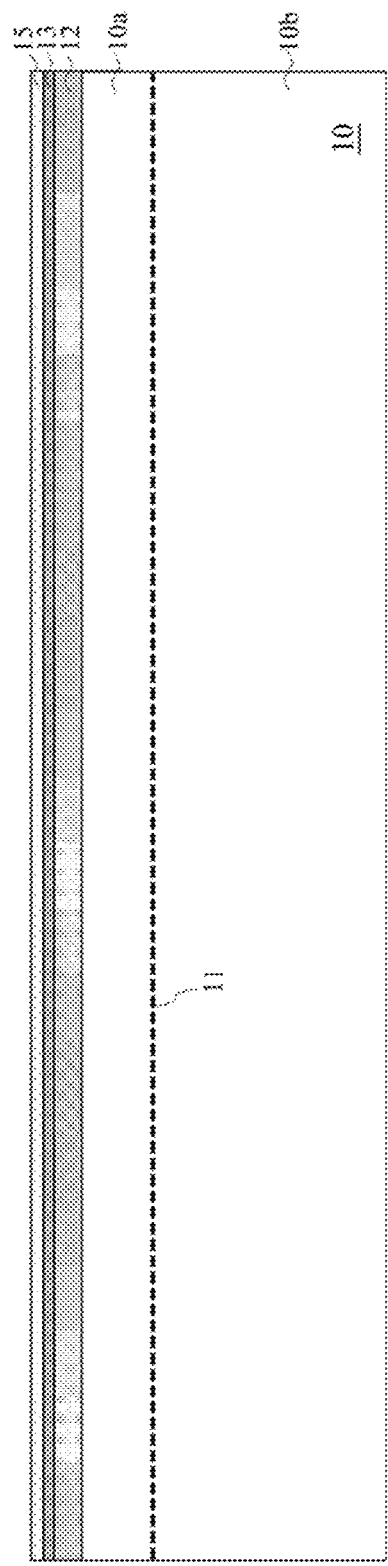
Figure 1F:
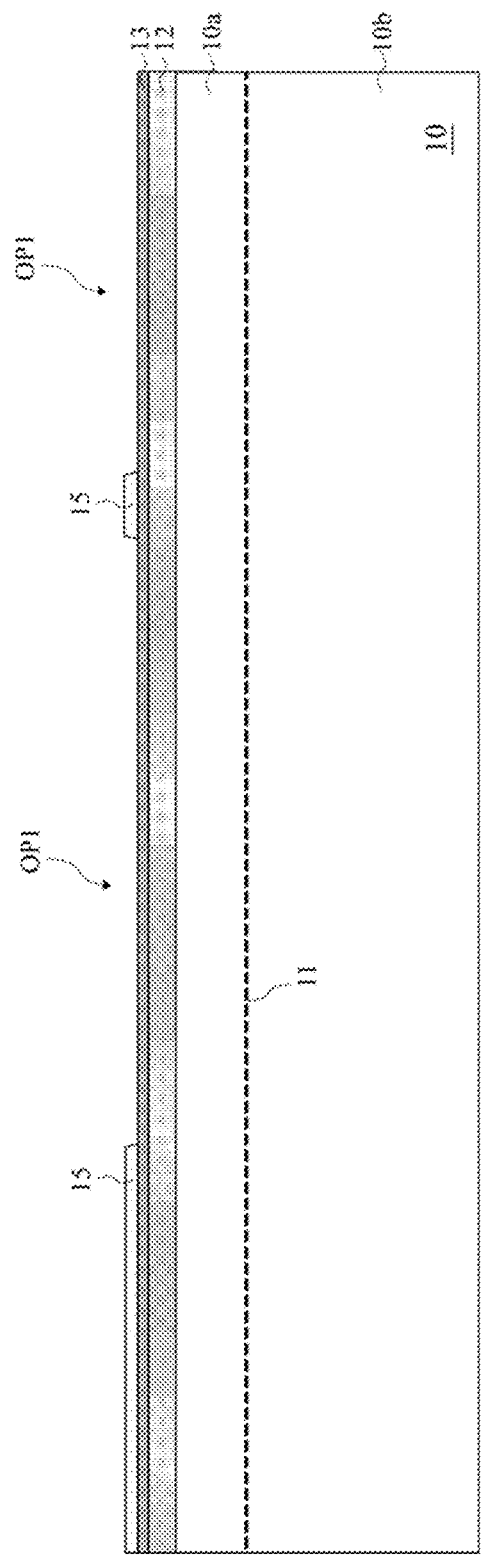
Figure 1G:
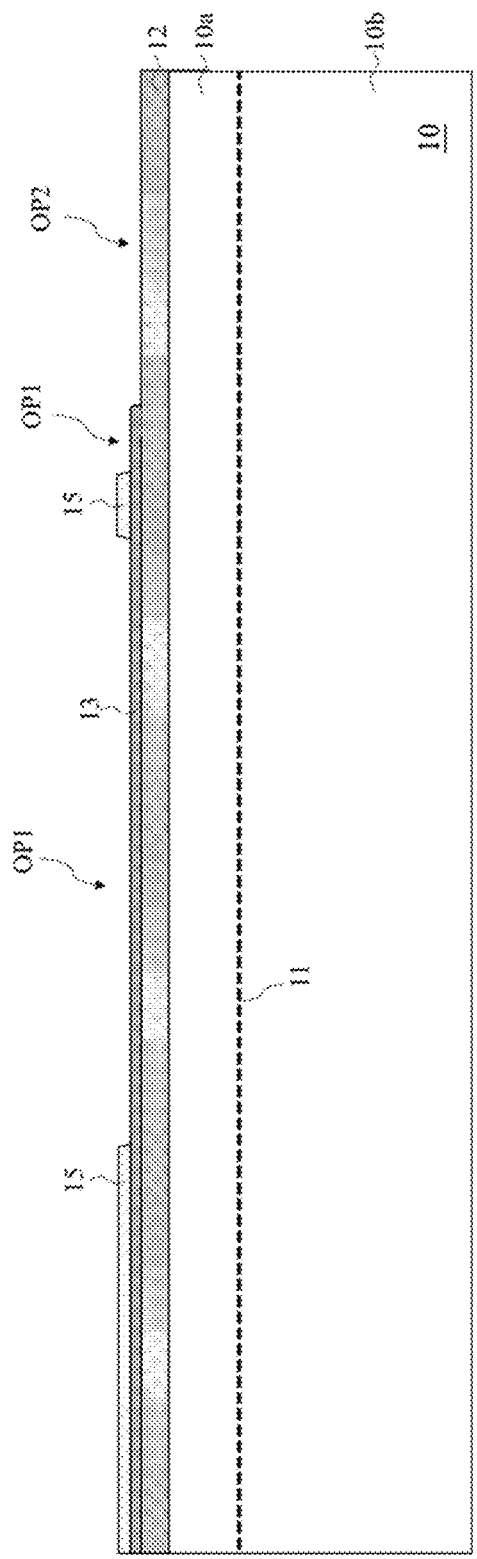
Figure 1H:
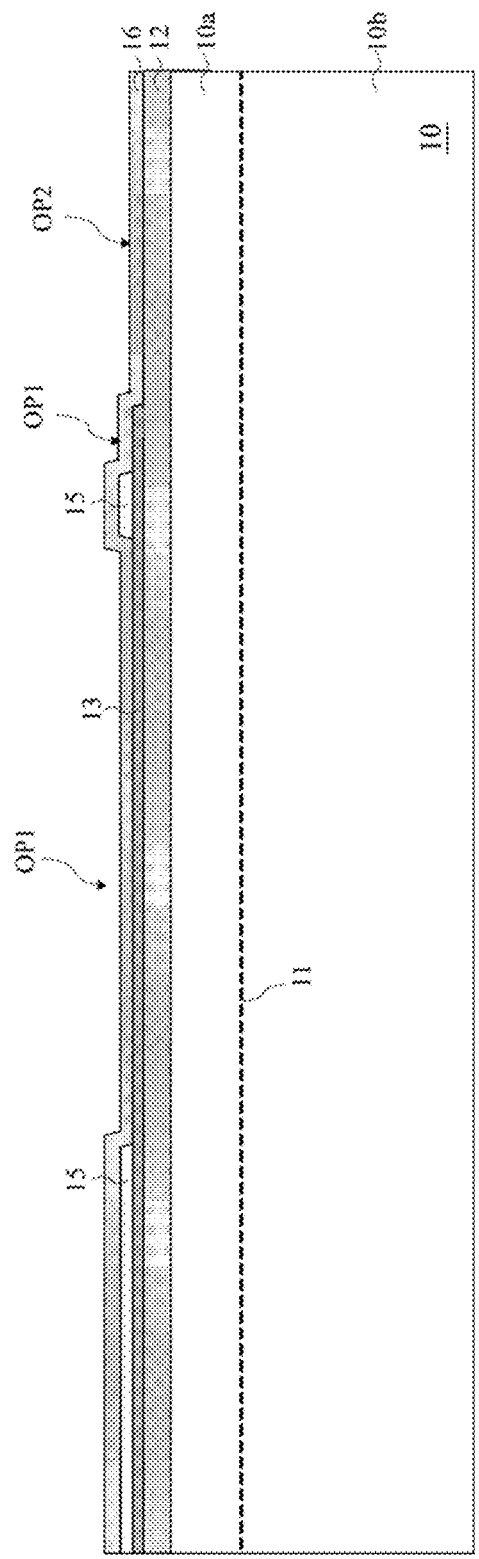
Figure 11:
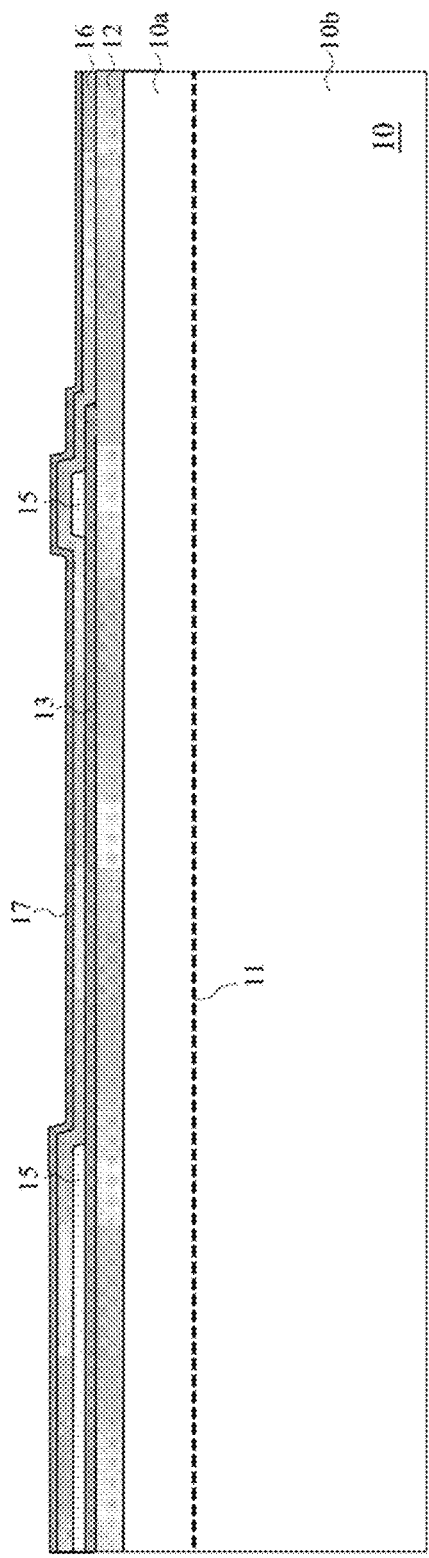
Figure 1J:
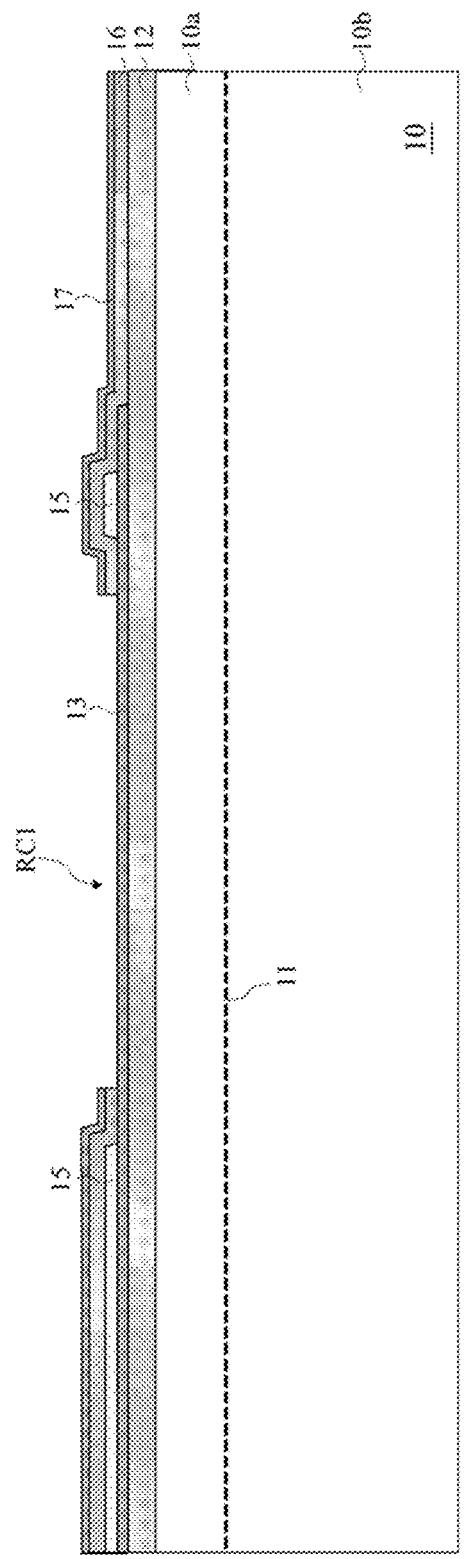
Figure 1K:
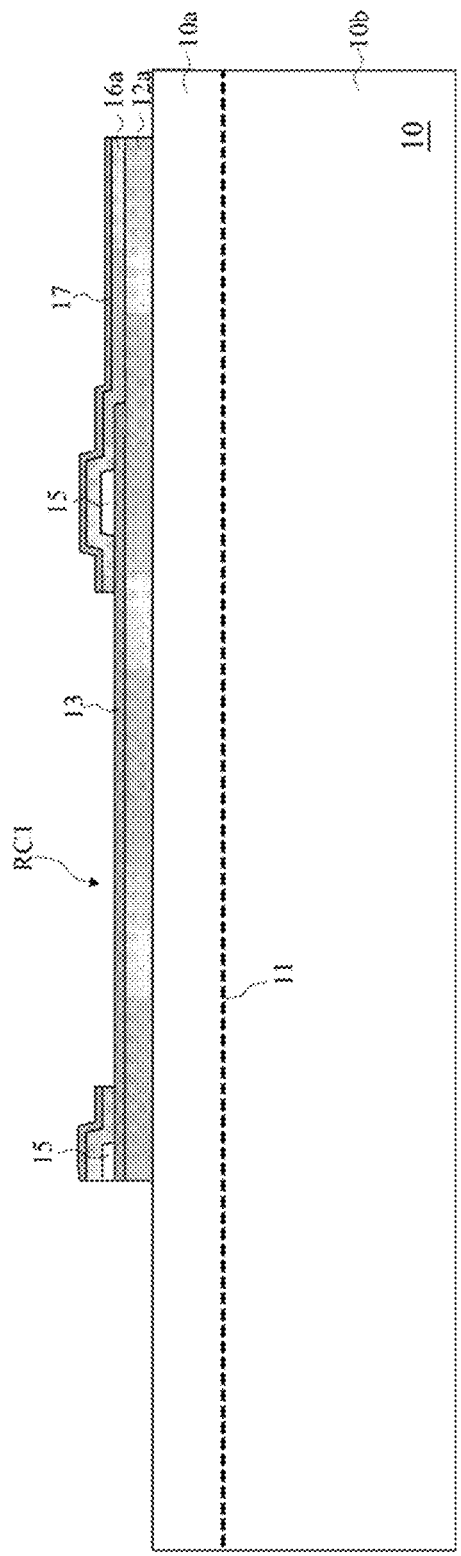
Figure 1L:
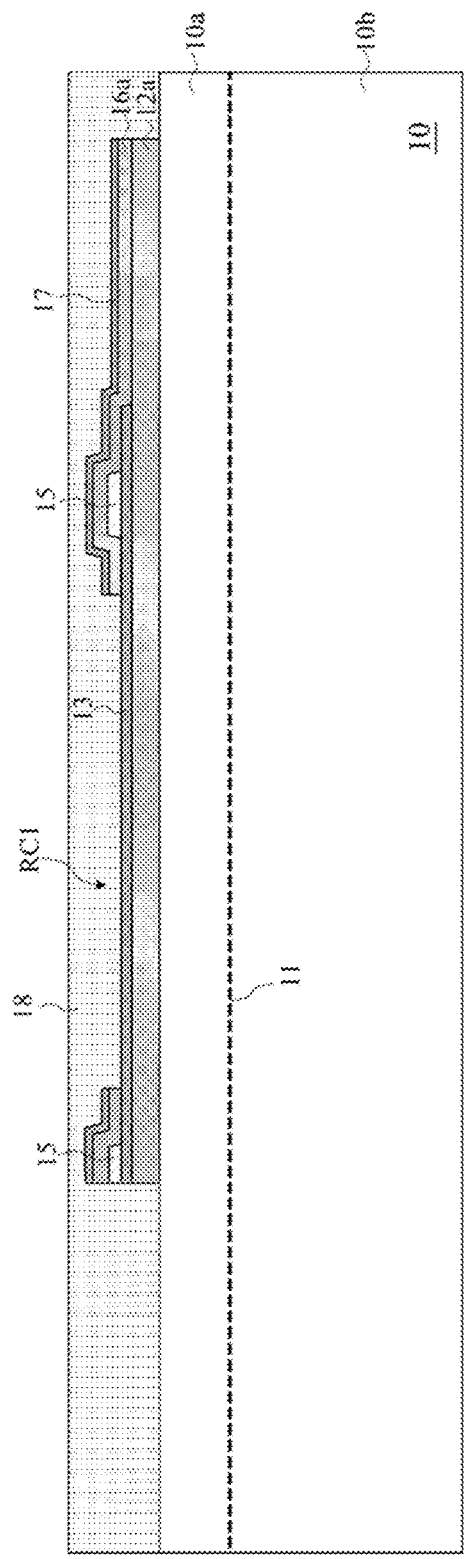
Figure 1M:
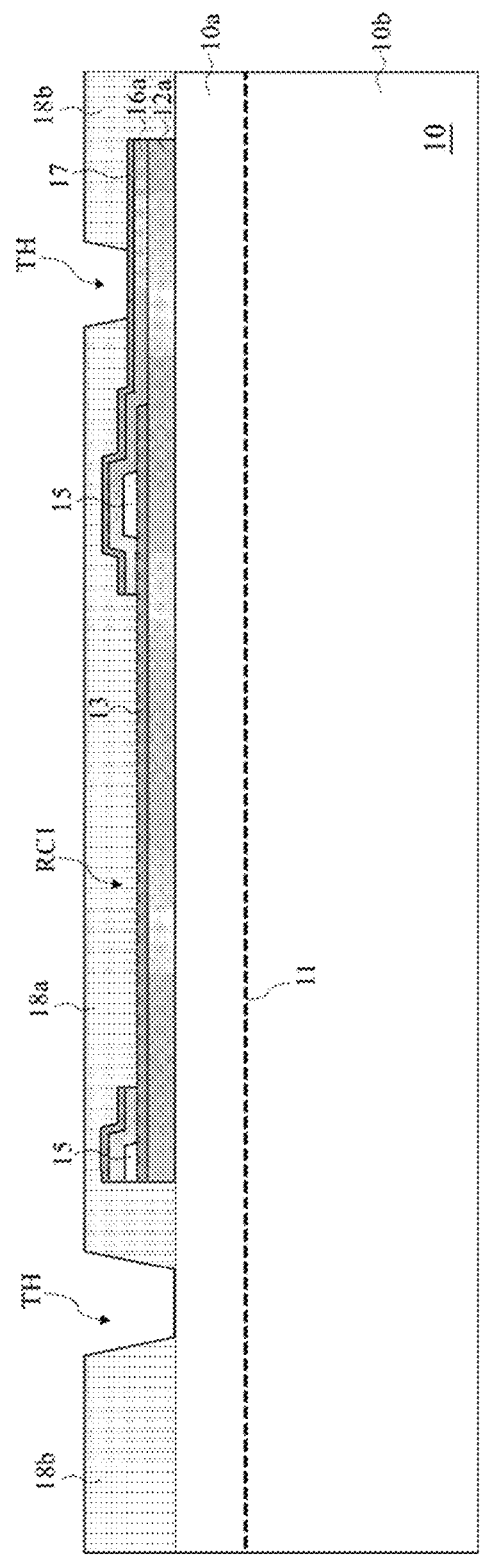
Figure 1N:
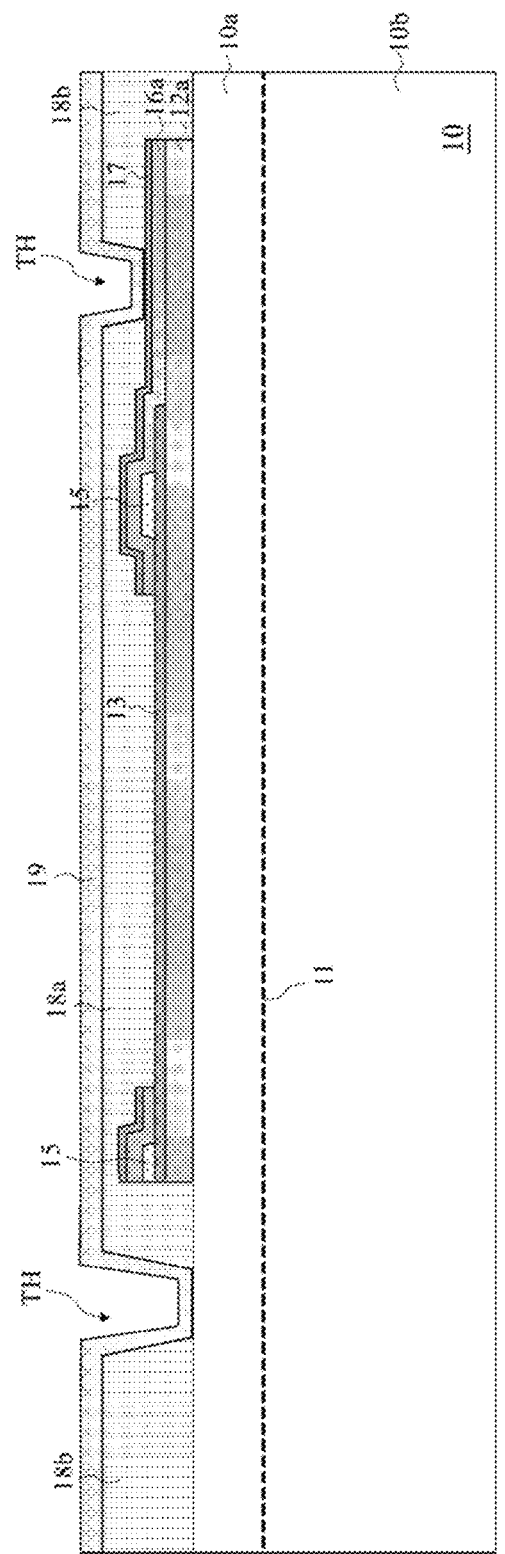
Figure 10:
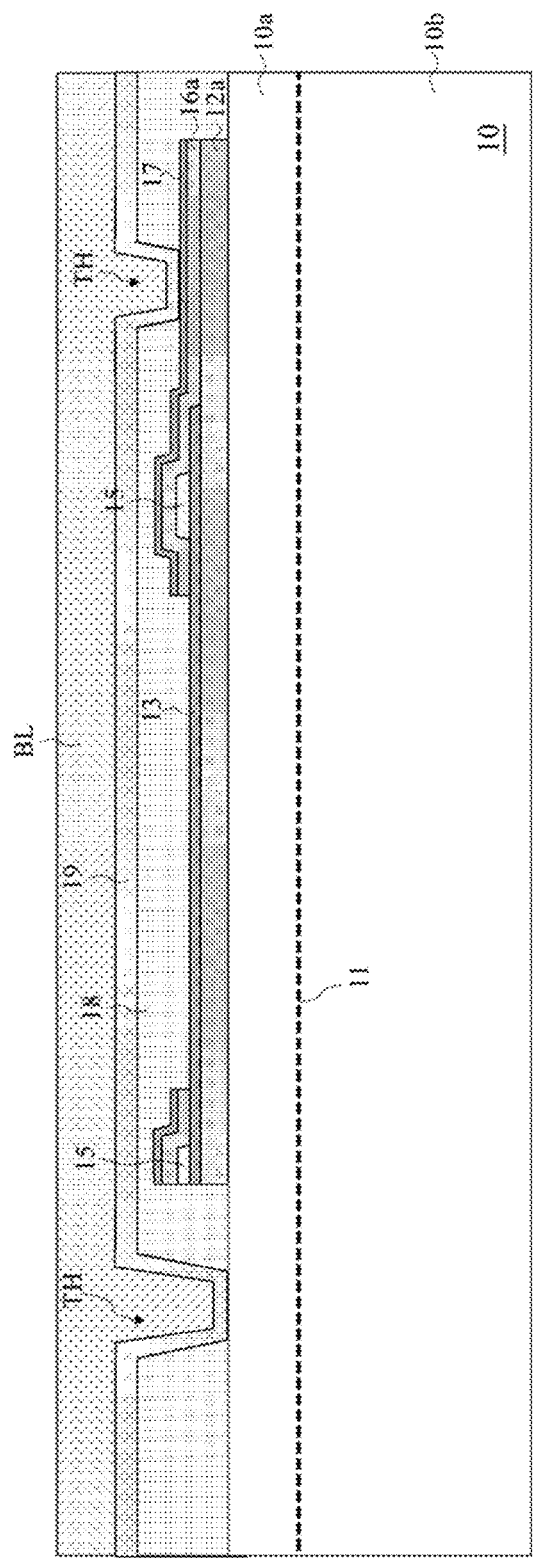
Figure 1P:
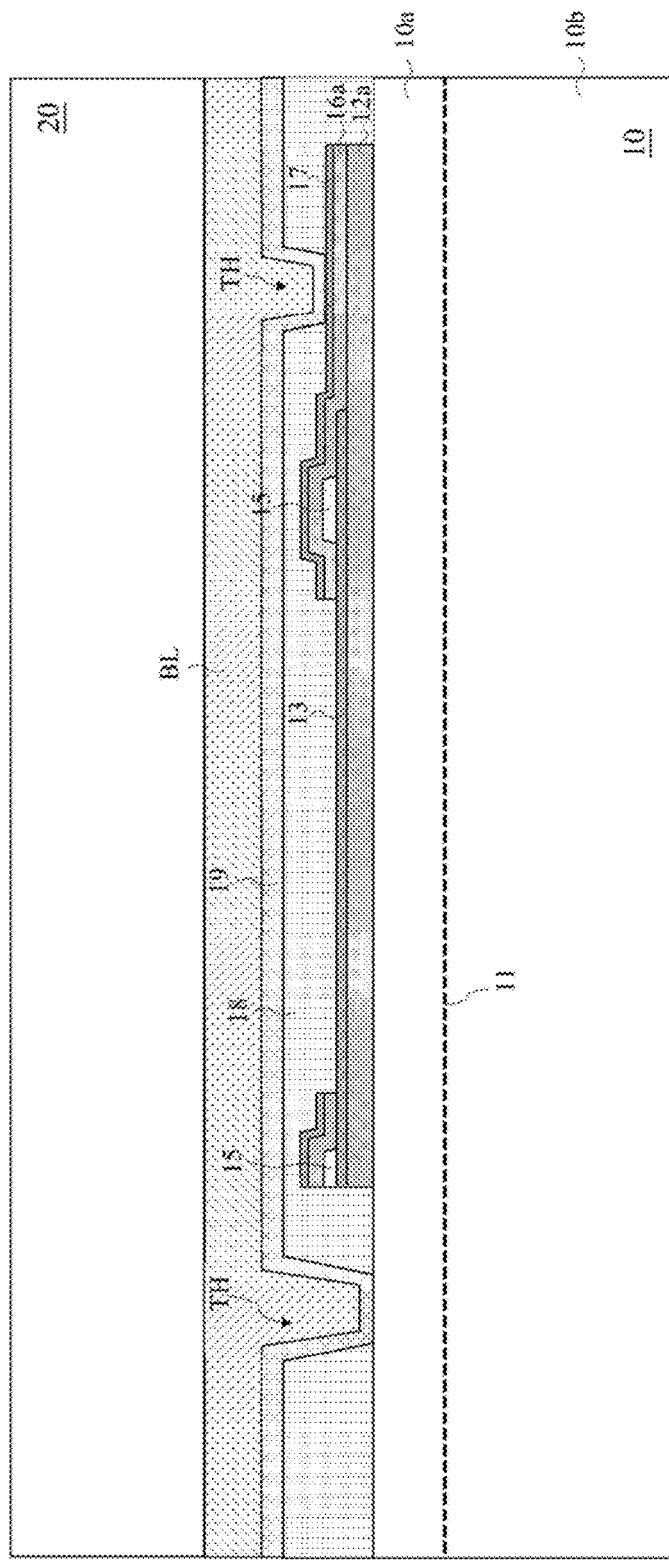
Figure 1Q:
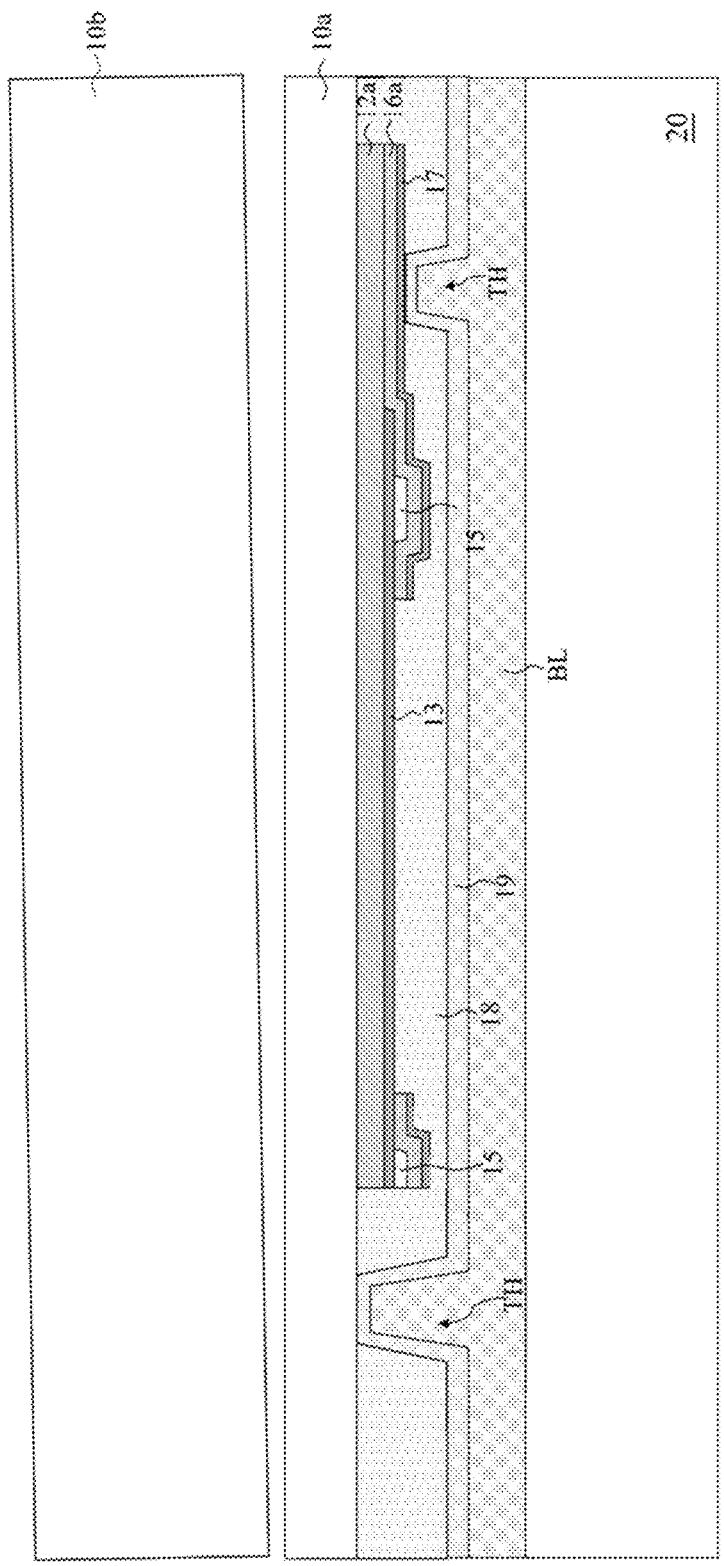
Figure 1R:
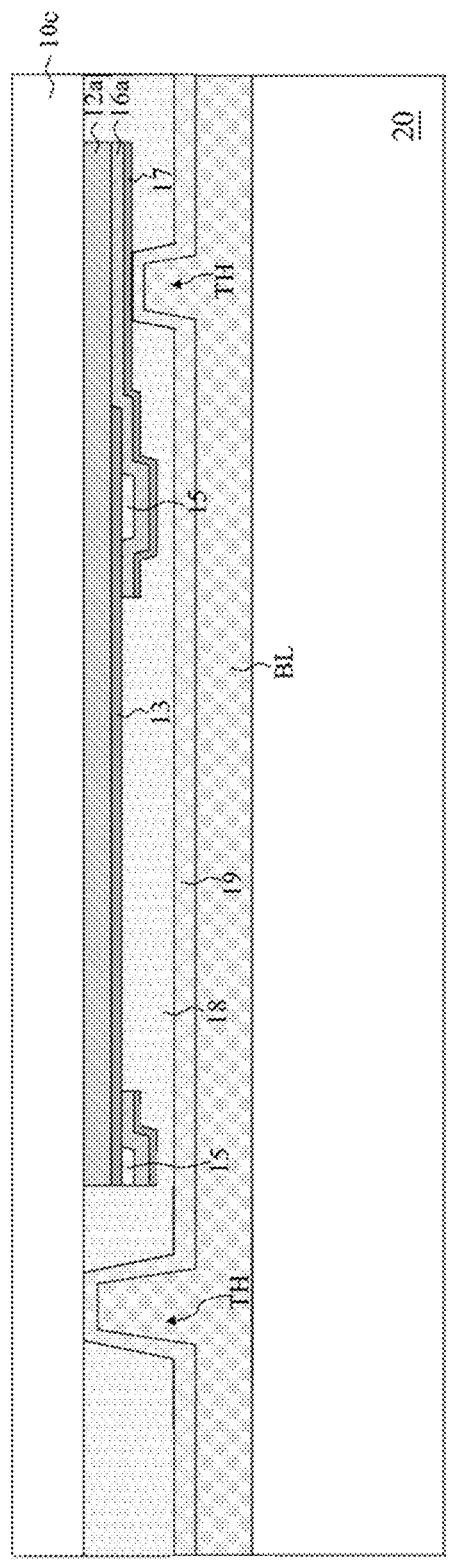
Figure 1S:
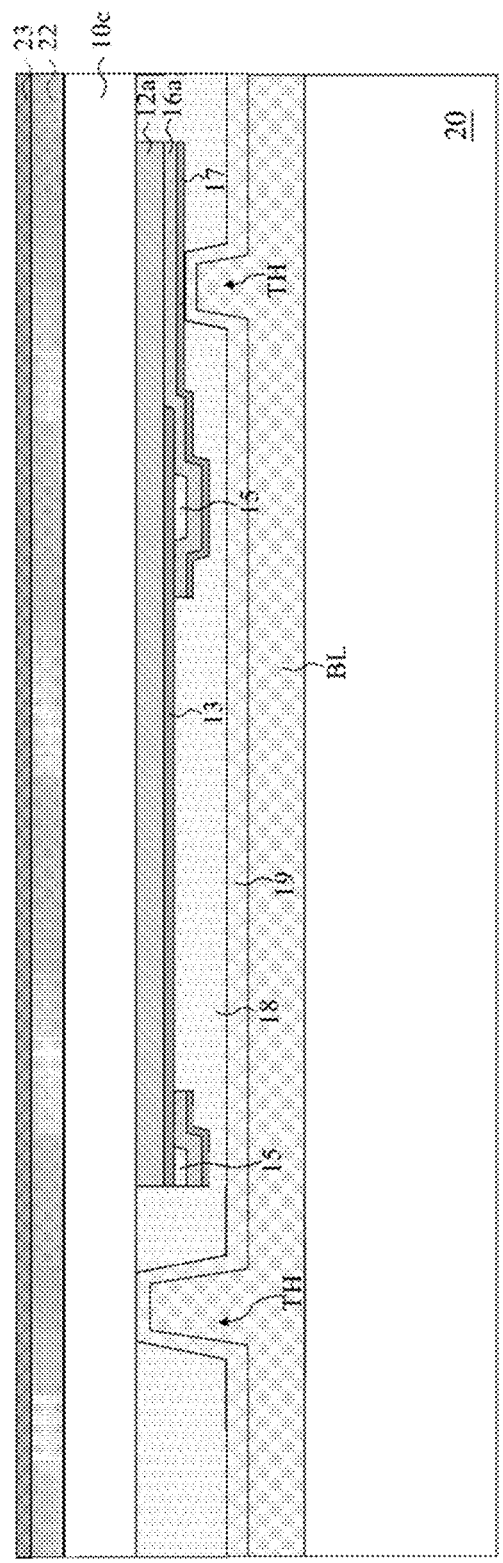
Figure 1T:
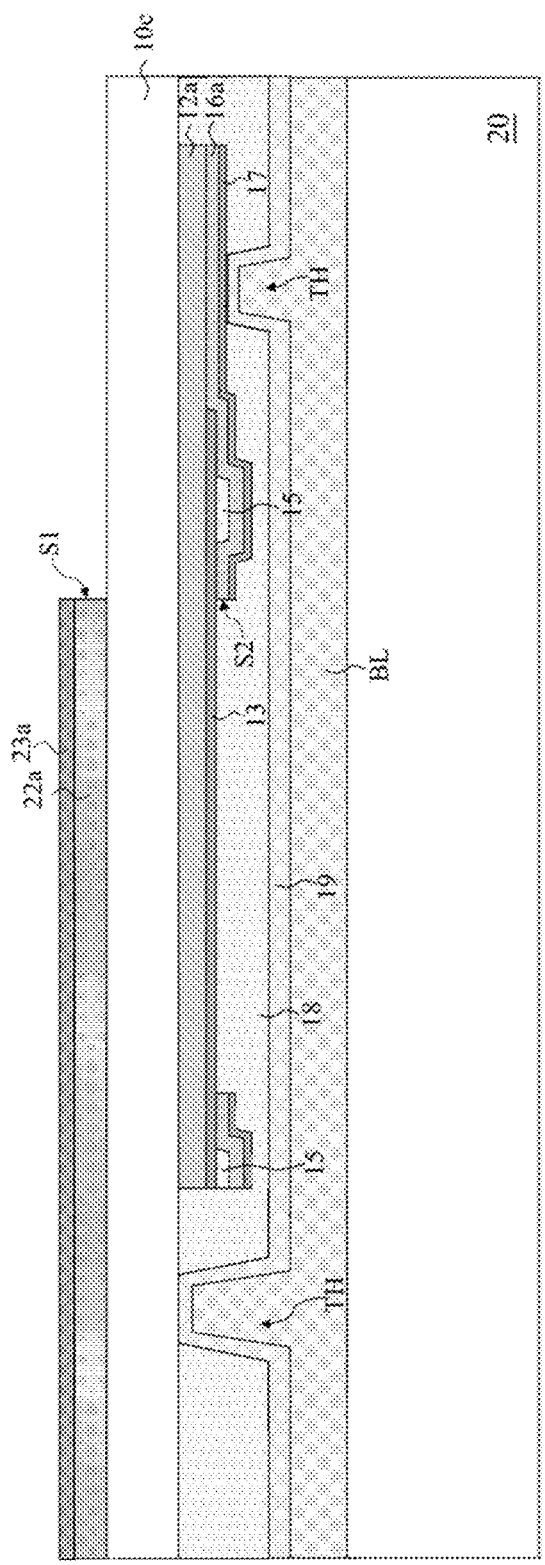
Figure 1U:
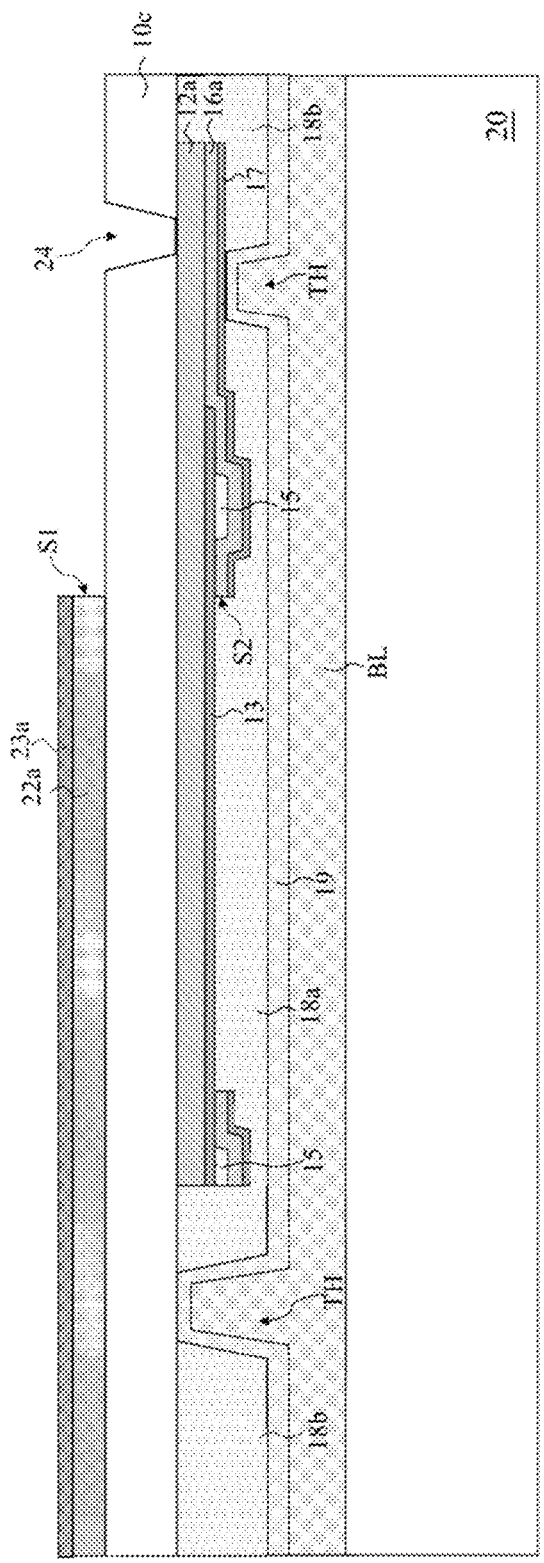
Figure 1V:
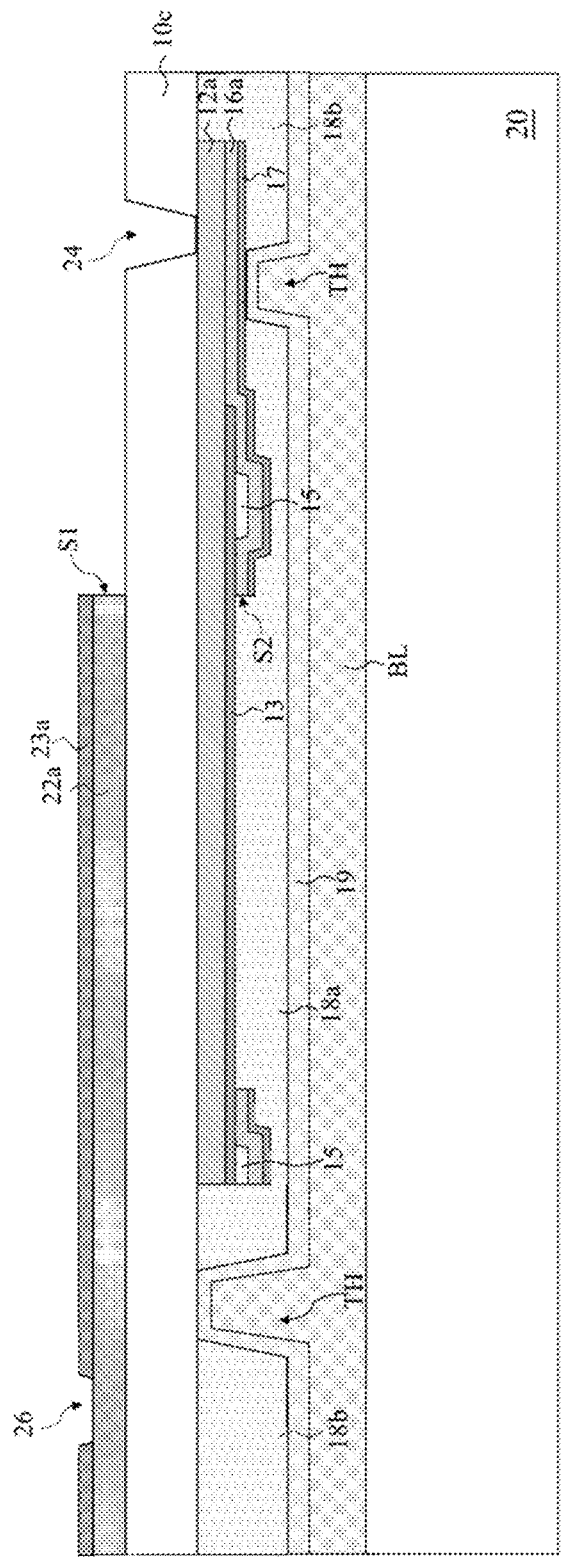
Figure 1W:
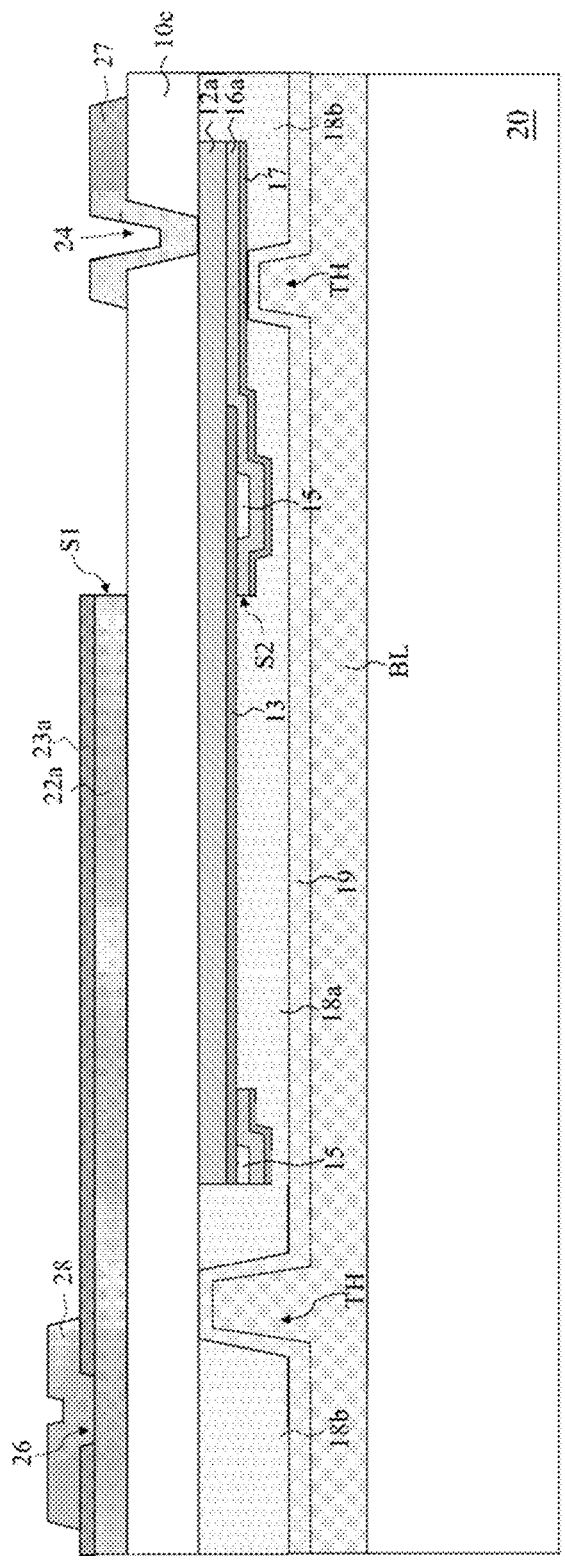
Figure 1X:
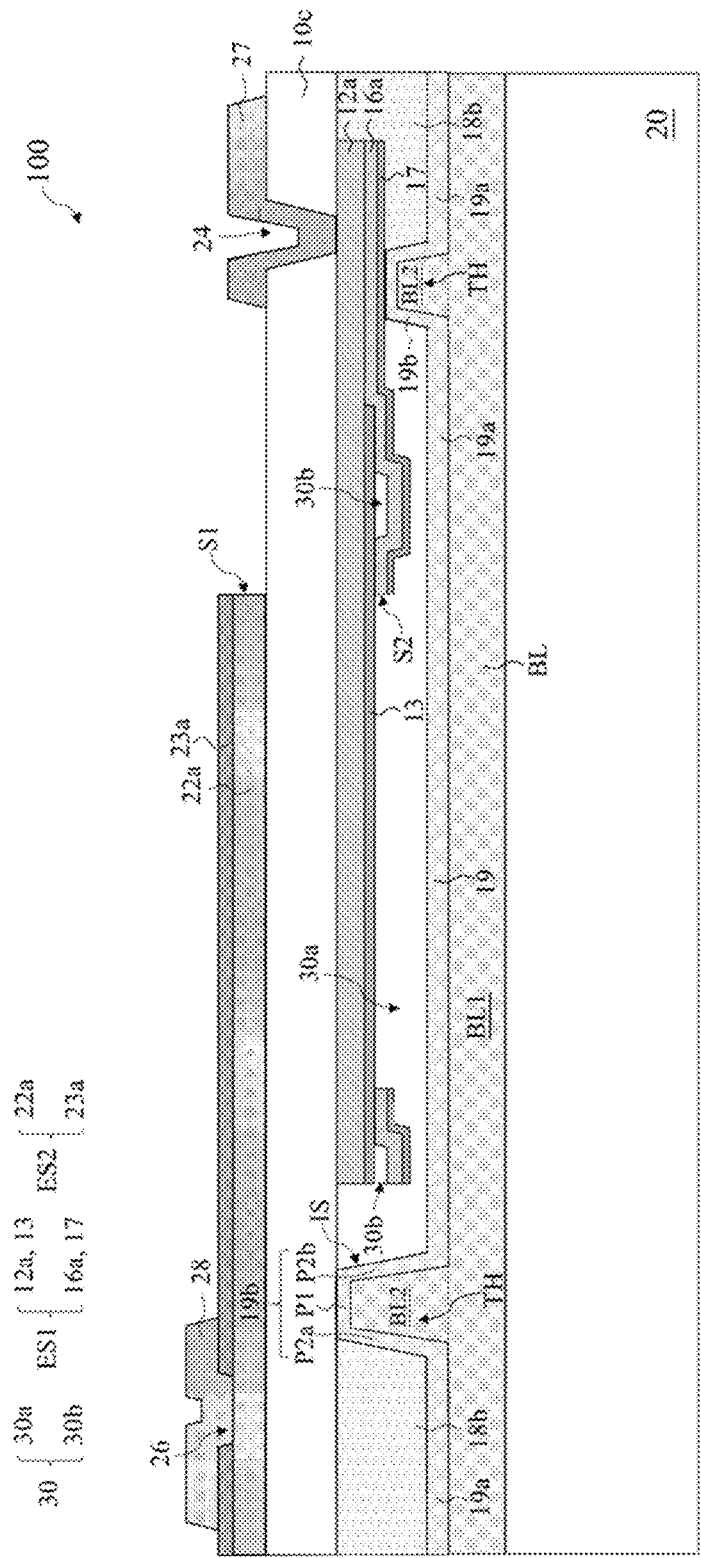
Figure 1Y:
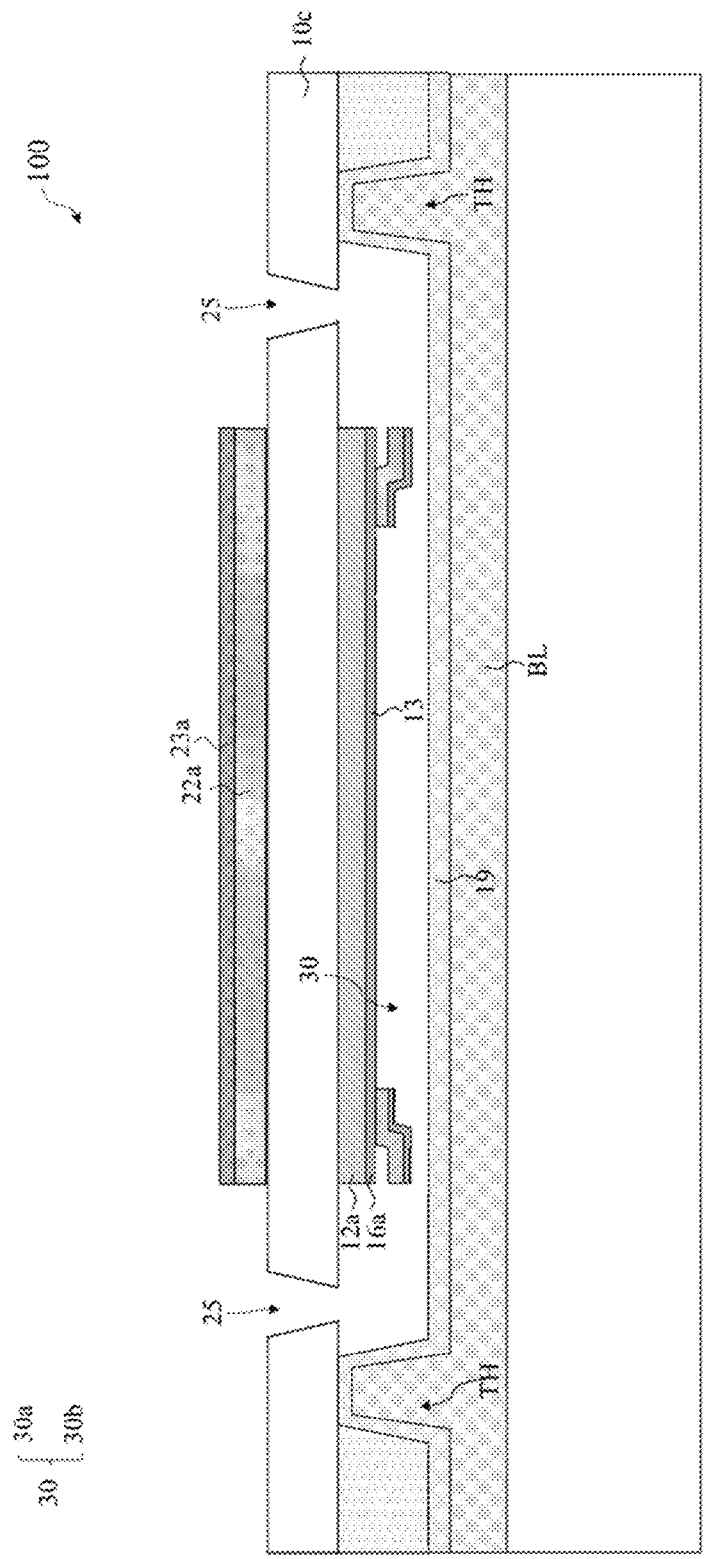
Figure 2:
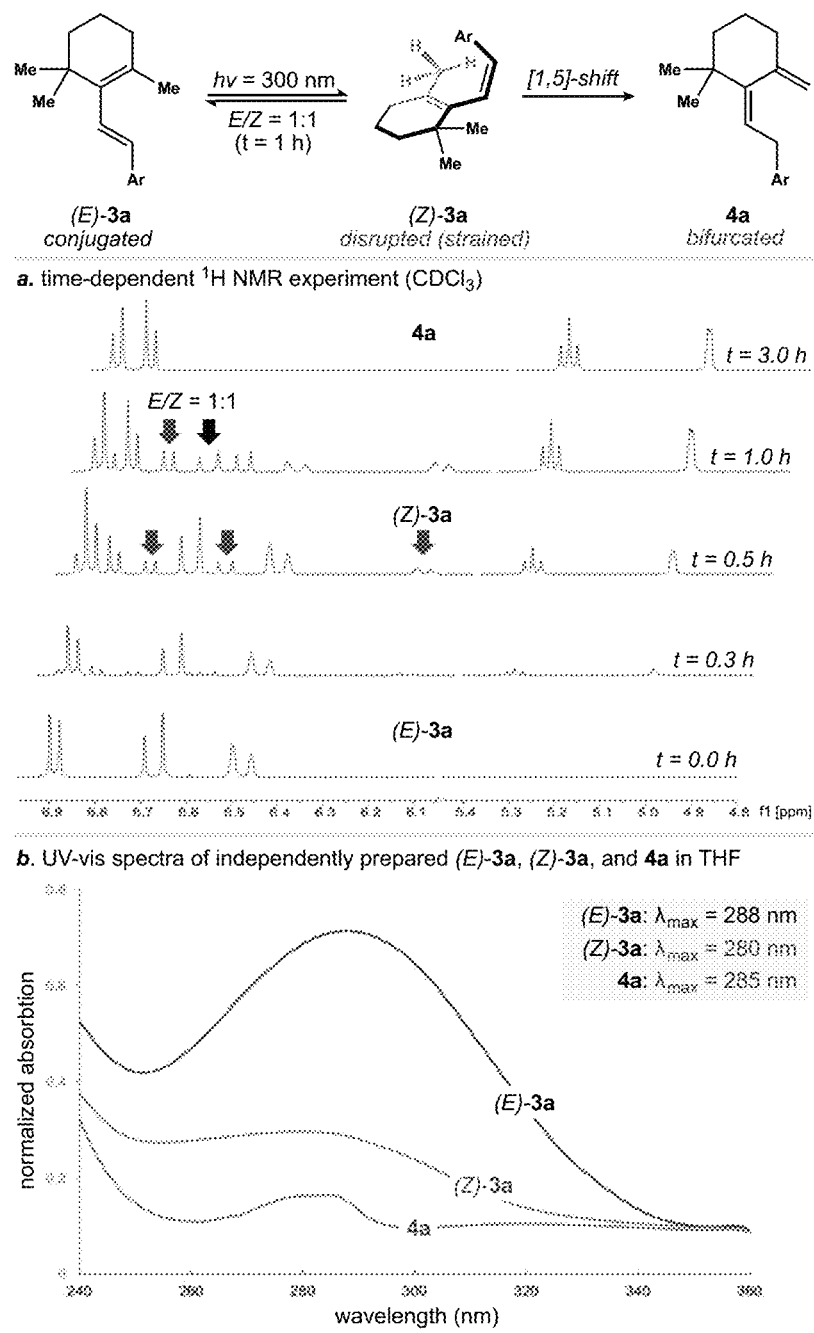
FIG. 2A is a schematic plan view illustrating a bulk acoustic wave resonator before a cavity is formed according to some embodiments of the present disclosure.
FIG. 2B is a schematic plan view illustrating a bulk acoustic wave resonator according to some embodiments of the present disclosure.
Figure 2A:
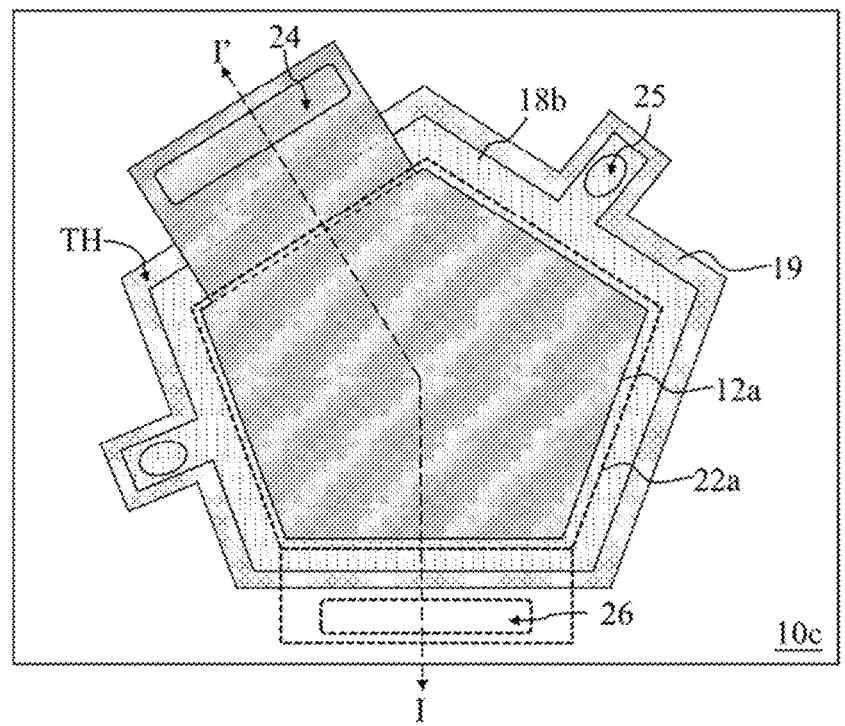
Figure 2B:
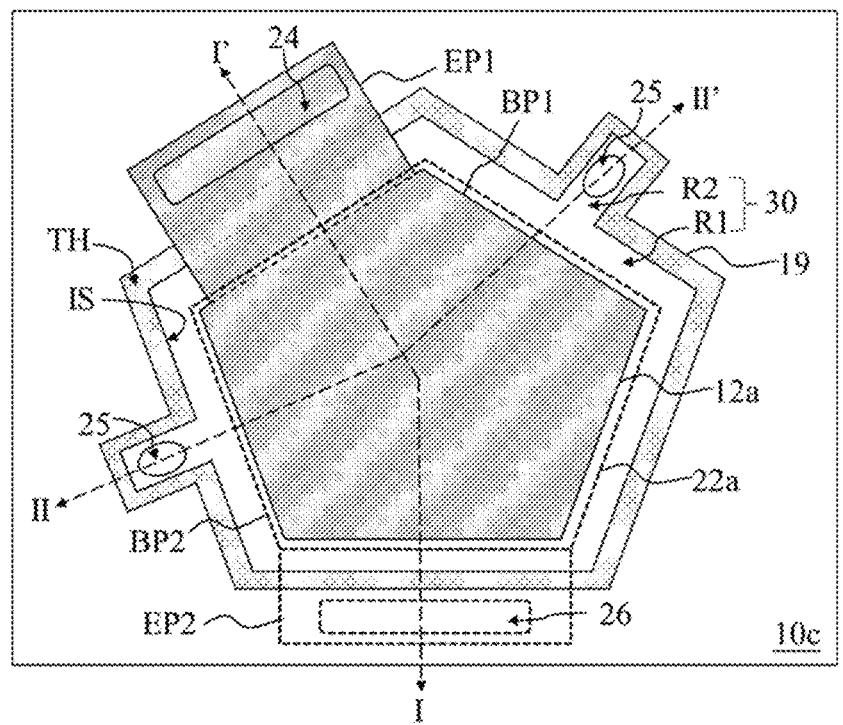

FIG. 1A to FIG. 1X are schematic cross-sectional views illustrating various stages in a manufacturing method of a bulk acoustic wave resonator according to some embodiments of the present disclosure. FIG. 1Y is a schematic cross-sectional view illustrating a bulk acoustic wave resonator according to some embodiments of the present disclosure. FIG. 2A is a schematic plan view illustrating a bulk acoustic wave resonator before a cavity is formed, according to some embodiments of the present disclosure, and FIG. 1V is a cross-sectional view taken along a line I-I' of FIG. 2A; FIG. 2B is a schematic plan view illustrating a bulk acoustic wave resonator according to some embodiments of the present disclosure. FIG. 1X is a cross-sectional view taken along a line I-I' of FIG. 2B; FIG. 1Y is a cross-sectional view taken along a line II-II' of FIG. 2B.

Referring to FIG. 1A, in some embodiments, a piezoelectric substrate 10 is provided. The piezoelectric substrate 10 includes a piezoelectric material having piezoelectric property, such as lithium niobate crystal, lithium tantalate crystal, or the like. The piezoelectric substrate 10 may be a single crystal piezoelectric substrate. In some embodiments, the piezoelectric substrate 10 is, for example, a piezoelectric wafer, and may be formed by, for example, a manufacturing method including steps of fabricating crystal bar and dicing process. For example, a crystal pulling process (e.g., a Czochralski process) is used to form a piezoelectric crystal bar, and a dicing process is performed on the piezoelectric crystal bar to form a plurality of piezoelectric wafers. In some embodiments, grinding, polishing, cleaning processes may be performed on the crystal bar/wafer before and/or after the dicing process. In some embodiments, the thickness T1 of the piezoelectric substrate 10 ranges from 200 μm to 400 μm, but the present disclosure is not limited thereto. The thickness of the piezoelectric substrate 10 can be adjusted according to product requirements.

Referring to FIG. 1B, in some embodiments, a cleavage plane 11 is defined in the piezoelectric substrate 10. The cleavage plane 11 is the plane along which the piezoelectric substrate 10 is to be split in a subsequent process step. For example, the cleavage plane is substantially parallel to the major surface of the piezoelectric substrate. In some embodiments, an ion implantation process is performed on the piezoelectric substrate 10, so as to implant implantation species (e.g., hydrogen ions, helium ions, the like, or combinations thereof) into the piezoelectric substrate 10 to form the cleavage plane 11. The implanted species may also be referred to as cleavage ions. In the ion implantation process, the cleavage ions pass through the upper portion of the piezoelectric substrate 10 and reach a desired depth of the piezoelectric substrate 10 to form the cleavage plane 11. The depth of the cleavage plane 11 may be adjusted by adjusting the energy of the ion implantation process. It should be understood that, although the cleavage plane 11 is shown in a dotted line in FIG. 1B, the cleavage plane 11 may be a doped layer included in the piezoelectric substrate 10, with a relatively high concentration of cleavage ions and having a certain thickness. In some embodiments, the cleavage plane 11 may also be referred to as a cleavage layer or a to-be-split layer.

After the cleavage plane 11 is formed, the piezoelectric substrate 10 includes an upper portion 10a above the cleavage plane 11 and a lower portion 10b below the cleavage plane 11. In some embodiments, the upper portion 10a may also be referred to as a first portion of the piezoelectric substrate 10, and the lower portion 10b may also be referred to as a second portion of the piezoelectric substrate 10, or vice versa. The upper portion 10a is used for forming a piezoelectric layer serving as a component of a resonator, and the lower portion 10b is a portion that is to be removed in the subsequent process. In some embodiments, the location of the cleavage plane 11 in the piezoelectric substrate 10, i.e., the depth of ion implantation, depends on the thickness of the piezoelectric layer required for the resonator. For example, the thickness of the piezoelectric layer required by the resonator may range from 0.2 μm to 2 μm. The depth T2 of the cleavage plane 11 (i.e., the depth of the ion implantation) may be approximately equal to or slightly greater than the required thickness of the piezoelectric layer, i.e., the depth T2 is in or slightly greater than the above-described thickness range of the piezoelectric layer. The depth T2 of the cleavage plane 11 is defined by the vertical distance from the top surface of the piezoelectric substrate 10 to the top surface of the cleavage plane 11 in a direction perpendicular to the top surface of the piezoelectric substrate 10, and is approximately equal to the thickness of the upper portion 10a of the piezoelectric substrate 10. In some embodiments, the depth T2 of the cleavage plane 11 (i.e., the thickness of the upper portion 10a) is approximately equal to or greater than the thickness of the piezoelectric layer in the final resonator structure. In some embodiments, the concentration of the implanted species in the piezoelectric substrate 10 is approximately normally distributed in a direction perpendicular to the top surface of the piezoelectric substrate 10, and has the highest concentration in the cleavage plane 11. However, the present disclosure is not limited thereto, and the implanted species in the piezoelectric substrate 10 may also adopt other types of distribution form. In some embodiments, small amounts of implantation species may also be included at the locations of the upper portion 10a and lower portion 10b of the piezoelectric substrate 10 adjacent to the cleavage plane 11. However, the present disclosure is not limited thereto.

Referring to FIG. 1C, an electrode layer (or may be referred to as a first electrode layer or a lower electrode layer) 12 is formed on the upper portion 10a of the piezoelectric substrate 10. The electrode layer 12 includes a metal material, such as molybdenum (Mo), aluminum (Al), copper (Cu), platinum (Pt), tantalum (Ta), tungsten (W), palladium (Pd), ruthenium (Ru), the like, alloys thereof, or combinations thereof. The electrode layer 12 is formed by, for example, a deposition process such as physical vapor deposition (PVD).

Referring to FIG. 1D, an intermediate dielectric layer 13 is formed on the electrode layer 12. The intermediate dielectric layer 13 may include any suitable dielectric material, such as aluminum nitride, silicon nitride, or the like, and may be formed by a deposition process such as chemical vapor deposition (CVD). In some embodiments, the thickness of the intermediate dielectric layer 13 in the direction perpendicular to the top surface of the piezoelectric substrate 10 ranges from 10 nm to 50 nm, for example, but the present disclosure is not limited thereto.

Referring to FIG. 1E, a sacrificial dielectric layer (or may be referred to as a sacrificial layer) 15 is formed on the intermediate dielectric layer 13. The material of the sacrificial dielectric layer 15 is different from the material of the intermediate dielectric layer 13. For example, the sacrificial dielectric layer 15 includes silicon oxide ($SiO_2$), and may be formed by a deposition process, such as CVD.

Referring to FIG. 1E and FIG. 1F, a patterning process is performed on the sacrificial dielectric layer 15 to remove a portion of the sacrificial dielectric layer 15 and form one or more recess OP1 in the sacrificial dielectric layer 15. In some embodiments, a center portion and a portion near an edge of the sacrificial dielectric layer 15 are removed. The patterning process may include: forming a patterned mask layer having openings (e.g., a patterned photoresist layer formed by a photolithography process including exposure and development) on the sacrificial dielectric layer 15, and then performing an etching process on the sacrificial dielectric layer using the patterned mask layer as an etching mask, so as to remove the portion of the sacrificial dielectric layer 15 exposed by the opening of the patterned mask layer, such that the pattern of the patterned mask layer is transferred into the sacrificial dielectric layer 15, and one or more recess OP1 are formed in the sacrificial dielectric layer 15. Afterwards, the patterned mask layer is removed through an ashing or a stripping process. In some embodiments, the intermediate dielectric layer 13 serves as an etch stop layer for the etch process of the sacrificial dielectric layer 15. The recess OP1 exposes the top surface of the intermediate dielectric layer 13 and has sidewalls defined by the sacrificial dielectric layer 15. The sidewalls of the recess OP1 may be inclined or straight, which is not limited in the present disclosure.

Referring to FIG. 1F and FIG. 1G, a patterning process is performed on the intermediate dielectric layer 13 to remove a portion of the intermediate dielectric layer 13 and form a recess OP2 in the intermediate dielectric layer 13. In some embodiments, an edge portion of the intermediate dielectric layer 13 is removed to expose an edge portion (i.e., an end part) of the electrode layer 12. For example, after the patterning process, the edges of the first electrode layer 12, the intermediate dielectric layer 13 and the sacrificial dielectric layer 15 on the same one side (e.g., the right side in the figure) have a stepped structure, while the edges thereof on the other side (e.g., the left side in the figure) are substantially aligned, and the intermediate dielectric layer 13 on the center portion of the electrode layer 12 is exposed by the sacrificial dielectric layer 15. The patterning process of the intermediate dielectric layer 13 is similar to the patterning process of the sacrificial dielectric layer 15 and includes the following processes: for example, a patterned mask layer (e.g., a patterned photoresist layer) is formed on the structure shown in FIG. 1F, the patterned mask layer covers the sacrificial dielectric layer 15 and fills into the recess OP1 to cover a portion of the intermediate dielectric layer 13, and has an opening exposing the edge portion of the intermediate dielectric layer 13; an etching process is then performed on the intermediate dielectric layer 13 using the patterned mask layer as an etching mask, so as to remove the edge portion of the intermediate dielectric layer 13 exposed by the patterned mask layer, and form the recess OP2. Thereafter, the patterned mask layer is removed through an ashing or a stripping process. The recess OP2 exposes a portion (e.g., an edge portion) of the electrode layer 12 and has sidewalls defined by the intermediate dielectric layer 13. In some embodiments, the recess OP2 is in spatial communication with a portion of the recess OP1.

Referring to 1H, in some embodiments, a conductive layer (or may be referred to as an edge protrusion layer or an electrode edge protrusion layer) 16 is formed over the piezoelectric substrate 10. The conductive layer 16 includes a suitable metal material, such as molybdenum (Mo), aluminum (Al), copper (Cu), platinum (Pt), tantalum (Ta), tungsten (W), palladium (Pd), and ruthenium (Ru), the like, alloys thereof, or combinations thereof. The material of the conductive layer 16 may be the same as or different from the material of the electrode layer 12. The conductive layer 16 may be formed, for example, by a deposition process, such as PVD. In some embodiments, the conductive layer 16 extends along the surfaces of the sacrificial dielectric layer 15, the intermediate dielectric layer 13 and the electrode layer 12, to cover the top surface and sidewalls of the sacrificial dielectric layer 15, the top surface and sidewalls of the intermediate dielectric layer 13, and the top surface of electrode layer 12. A portion of the conductive layer 16 is located in the recess OP2 of the intermediate dielectric layer 13 (e.g., at an edge of the electrode layer 12) and in physical contact with and electrically connected to the electrode layer 12, while the rest of the conductive layer 16 is located on the intermediate dielectric layer 13 and/or the sacrificial dielectric layer 15, and is separated from the electrode layer 12 by the intermediate dielectric layer 13 and/or the sacrificial dielectric layer 15. In some embodiments, the conductive layer 16 is a conformal layer. Herein, "conformal layer" represents that the layer has a substantially uniform thickness over the region on which the layer extends. However, the present disclosure is not limited thereto.

Referring to FIG. 1H and FIG. 1I, a passivation layer 17 is formed over the piezoelectric substrate 10 to cover the conductive layer 16. The passivation layer 17 includes a non-metal material, such as a dielectric material. The material of the passivation layer 17 is different from the material of the sacrificial dielectric layer 15, and may be the same as or different from the material of the intermediate dielectric layer 13. For example, the passivation layer 17 may include aluminum nitride, silicon nitride, the like, or combinations thereof. The passivation layer 17 may be formed by, for example, a deposition process, such as CVD.

Referring to FIG. 1I and FIG. 1J, in some embodiments, a patterning process is performed on the passivation layer 17 and the conductive layer 16 to remove portions of the passivation layer 17 and the conductive layer 16, so as to form a recess RC1 in the passivation layer 17 and the conductive layer 16, and a portion of the top surface of the intermediate dielectric layer 13 is exposed. The patterning process may include the following processes: a patterned mask layer (e.g., a patterned photoresist layer) is formed on the top surface of the passivation layer 17, and portions of the passivation layer 17 and the conductive layer 16 exposed by the patterned mask layer are etched and removed, with the patterned mask layer serving as an etching mask. Thereafter, the patterned mask layer is removed through an ashing or a stripping process. Referring to FIG. 1J, in some embodiments, the recess RC1 is defined by the top surface of the intermediate dielectric layer 13 and the sidewalls (e.g., inner sidewalls) of the passivation layer 17 and the conductive layer 16. In some embodiments, the passivation layer 17 and the conductive layer 16 are used for forming the electrode edge protrusion structure, and this patterning process (i.e., the sidewall of the formed recess RC1) is used for defining the inner edge of the subsequently formed electrode edge protrusion structure.

Referring to FIG. 1J and FIG. 1K, a patterning process is then performed on the passivation layer 17, the conductive layer 16, the sacrificial dielectric layer 15, the intermediate dielectric layer 13 and the electrode layer 12, so as to form a first electrode structure including an electrode 12a and a conductive layer (or may be referred to as an edge protrusion layer) 16a. In some embodiments, the patterning process includes the following processes: a patterned mask layer is formed over the piezoelectric substrate 10, the patterned mask layer covers a portion of the surface of the passivation layer 17 and fills into the recess RC1, and exposes an edge portion of the passivation layer 17; thereafter, an etching process using the patterned mask layer as an etch mask is performed on the passivation layer 17, the conductive layer 16, the sacrificial dielectric layer 15, the intermediate dielectric layer 13 and the electrode layer 12, so as to remove portions of these layers exposed by the patterned mask layer and expose a portion of the top surface of piezoelectric substrate 10; afterwards, the patterned mask layer is removed through an ashing or a stripping process. In some embodiments, the number of layers of material layers etched by the etching process in different regions may be different. For example, in the structure shown in FIG. 1J, the electrode layer 12 has a first periphery region (e.g., the left region shown in the figure) and a second periphery area (e.g., the right region shown in the figure) that are to be removed on opposite sides of electrode 12a (FIG. 1K). The first periphery region of the electrode layer 12 is covered by, for example, four material layers including the passivation layer 17, the conductive layer 16, the sacrificial dielectric layer 15 and the intermediate dielectric layer 13, while the second periphery region of the electrode layer 12 is, for example, covered by two material layers including the passivation layer 17 and the conductive layer 16. Therefore, in the patterning process, the number of layers (i.e. five layers) need to be removed for removing the first periphery region of the electrode layer 12 and the layers overlying thereof is greater than the number of layers (i.e., three layers) need to be removed for removing the second periphery region of the electrode layer 12 and the layers overlying thereof. In this embodiment, the etching processes in the different regions may be performed simultaneously or sequentially. However, the present disclosure is not limited thereto. In some other embodiments, in the above etching process, the number of layers of etched material layers in different regions may be the same. For example, the portion of the sacrificial dielectric layer 15 and the portion of the intermediate dielectric layer 13 on the first periphery region of the electrode layer 12 that need to be removed in the etching process may be respectively removed in the patterning processes shown in FIG. 1E to FIG. 1F and FIG. 1F to FIG. 1G, such that the to-be-removed first periphery region of the electrode layer 12 is not covered by the sacrificial dielectric layer 15 and the intermediate dielectric layer 13, and the number of removed layer in the first periphery region is equal to the number of removed layer in the second periphery region in the etching process.

Referring to FIG. 1L, a dielectric layer 18 is formed over the piezoelectric substrate 10, in some embodiments, the dielectric layer 18 covers the upper portion 10*a* of the piezoelectric substrate 10 and the first electrode structure, and the top surface of the dielectric layer 18 is higher than the topmost surface of the passivation layer 17. The material of the dielectric layer 18 may be the same as or similar to the material of the sacrificial dielectric layer 15, and different from the materials of the passivation layer 17 and the intermediate dielectric layer 13. The dielectric layer 18 may include a suitable dielectric material, such as silicon oxide, for example, and may be formed by a deposition process such as CVD, spin coating, or the like. In some embodiments, the dielectric layer 18 has a substantially flat surface. For example, a dielectric material may be deposited, and a planarization process (e.g., a chemical mechanical polishing process (CMP)) may be performed on the dielectric material, so as to form the dielectric layer 18 having a substantially flat surface.

Referring to FIG. 1L to FIG. 1M, a patterning process (e.g., including photolithography and etching processes) is performed on the dielectric layer 18 to remove a portion of the dielectric layer 18 and form a trench TH in the dielectric layer 18. In some embodiments, the trench TH exposes a portion of the top surface of the upper portion 10 of the piezoelectric substrate 10 and a portion of the top surface of the passivation layer 17. The cross-sectional shape of the trench TH may be trapezoidal, square, rectangular or the like. The width of the trench TH in the direction parallel to the top surface of the piezoelectric substrate 10 ranges from 3 μm to 20 μm, for example. In some embodiments, upon being viewed in a plan view, e.g., as shown in FIG. 2A, the trench TH is ring-shaped, such as irregular ring-shaped or other types of ring-shaped structure. The trench TH may be a close ring-shaped structure, and the trench TH divides the dielectric layer 18 into a sacrificial dielectric part 18*a* and a periphery dielectric part 18*b* spaced apart from each other. In other words, the periphery dielectric part 18*b* continuously extends over the edge of the piezoelectric substrate 10 and surrounds the sacrificial dielectric part 18*a*, and is spaced apart from the sacrificial dielectric part 18*a* by the trench TH.

Referring to FIG. 1N, a boundary layer 19 is formed over the piezoelectric substrate 10 to cover the side of the dielectric layer 18 away from the piezoelectric substrate 10 and fill into the trench TH. The material of the boundary layer 19 is different from the material of the dielectric layer 18. In some embodiments, the material of the boundary layer 19 may include a semiconductor material, a dielectric material, the like, or combinations thereof. For example, the boundary layer 19 may include amorphous silicon, polysilicon, silicon nitride, aluminum nitride, the like, or combinations thereof. The boundary layer 19 may be formed by a suitable deposition process, such as CVD, atomic layer deposition (ALD), or the like.

In some embodiments, the boundary layer 19 partially fills the trench TH, and lines the surface of trench TH, for example. The boundary layer 19 extends along the top surface of the dielectric layer 18 and the surface of the trench TH and is, for example, a conformal layer. The boundary layer 19 is in contact with the top surface of the upper portion 10*a* of the piezoelectric substrate 10 at the bottom surface of a portion of the trench TH, and is in contact with the passivation layer 17 at the bottom surface of another portion of the trench TH. In other words, the boundary layer 19 covers the top surface and sidewalls of the periphery dielectric part 18*b*, and surrounds and covers the top surface and sidewalls of the sacrificial dielectric part 18*a*. The sacrificial dielectric part 18*a* is located in a space (e.g., an enclosed space) defined by the boundary layer 19, the upper portion 10*a* of the piezoelectric substrate 10, and the surfaces of the first electrode structure, and is enclosed and surrounded by these layers.

Referring to FIG. 1O, a bonding layer BL is formed on the boundary layer 19 to cover the surface of the boundary layer 19 and fill the trench TH. In some embodiments, the bonding layer BL substantially fills up the trench TH, and the top surface of the bonding layer BL is higher than the topmost surface of the boundary layer 19. The material of the bonding layer BL may be different from the material of the boundary layer 19, for example, the material of the bonding layer BL may be a dielectric material such as silicon oxide ($SiO_2$). The forming method of the bonding layer BL may include depositing a bonding material layer and then performing a planarization process (e.g., CMP) on the bonding material layer. In some embodiments, the bonding layer BL has a substantially flat top surface, and the top surface of the bonding layer BL is substantially parallel to the top surface of the upper portion 10*a* of the piezoelectric substrate 10.

Referring to FIG. 1P, a substrate 20 is provided, and the substrate 20 is bonded to the bonding layer BL. The material of the substrate 20 may be different from the material of the piezoelectric substrate 10, but the present disclosure is not limited thereto. In some embodiments, the substrate 20 may include a semiconductor material, a dielectric material, the like, or combinations thereof. For example, the substrate 20 may include silicon (Si), silicon oxide ($SiO_2$), polysilicon, silicon carbide, the like, or combinations thereof. In some embodiments, the substrate 20 includes a semiconductor substrate (e.g., a silicon-containing substrate) and a dielectric material (e.g., silicon oxide) located on the semiconductor substrate. The bonding process of the substrate 20 and the bonding layer BL may include, for example, bonding the dielectric material (e.g., silicon oxide) on the substrate 20 and the bonding layer BL by dielectric-to-dielectric bonding through a fusion bonding process, and a dielectric-to-dielectric bonding interface is formed between the substrate 20 and the bonding layer BL. However, the present disclosure is not limited thereto. In some other embodiments, the substrate 20 and the bonding layer BL may also be bonded together by semiconductor-to-dielectric bonding.

Referring to FIG. 1P and FIG. 1Q, the piezoelectric substrate 10 is split along the cleavage plane 11, such that the upper portion 10*a* and the lower portion 10*b* are separated from each other. In some embodiments, the split of the piezoelectric substrate 10 may be caused by performing an annealing process on the piezoelectric substrate 10. For example, the structure of FIG. 1P is turned over, and an annealing process is then performed on the piezoelectric substrate 10 under a temperature of 400° C. to 650° C., in some embodiments in which the cleavage plane 11 is defined, for example, by implanting hydrogen ions in the piezoelectric substrate 10, the hydrogen forms bubbles inside the piezoelectric substrate 10 during the annealing process, thereby generating a hydrogen stripping layer in the piezoelectric substrate 10 along the cleavage plane 11, and causing the piezoelectric substrate 10 to split along the hydrogen stripping layer. In some embodiments, the split of the piezoelectric substrate 10 may also be caused by mechanical force in addition to or instead of annealing. The split of the piezoelectric substrate 10 removes the lower portion 10b and remains the upper portion 10a for forming the piezoelectric thin layer.

Referring to FIG. 1Q and FIG. 1R, in some embodiments, after the lower portion 10b is removed, a planarization process (e.g., CMP) may be optionally performed on the upper portion 10a to form a piezoelectric layer 10c having a substantially flat surface. In some embodiments, after the annealing process is performed to split the piezoelectric substrate 10, the exposed surface layer (i.e., at the location previously adjacent to the cleavage plane 11) of the upper portion 10a may have a small amount of residual cleavage ions (H/He ions), and the surface layer including residual ions is removed in the above-described planarization process, such that the piezoelectric layer 10c is substantially free of residual H or He ions and has good piezoelectric property.

In some embodiments, a thickness measurement of the piezoelectric layer 10c may be performed to ensure that the piezoelectric layer 10c has the appropriate thickness required for the device. It should be understood that, the thickness of the piezoelectric layer 10c refers to the thickness thereof in a direction perpendicular to the surface (e.g., the top surface) of the substrate 20. In some embodiments, the planarization process is performed until the piezoelectric layer 10c has the required thickness. In an alternative embodiment, the planarization process is performed until the piezoelectric layer 10c has a thickness close to the required thickness, thereafter, a portion of the piezoelectric layer 10c may be removed by a suitable removal method, such as an ion beam etching (IBE) or ion beam trimming, such that the thickness of the piezoelectric layer 10c precisely reaches the required thickness and the thickness is more uniform.

Referring to FIG. 1S, an electrode layer 22 and a passivation layer 23 are sequentially formed on the piezoelectric layer 10c. In some embodiments, the electrode layer 22 may also be referred to as a second electrode layer or an upper electrode layer. The material of the electrode layer 22 is similar to, and may be the same as or different from the material of the electrode layer 12. For example, the electrode layer 22 includes a suitable conductive material, such as, molybdenum (Mo), aluminum (Al), copper (Cu), platinum (Pt), tantalum (Ta), tungsten (W), palladium (Pd), ruthenium (Ru), the like, alloys thereof, or combinations thereof, and may be formed by a deposition process such as PVD. The passivation layer 23 is formed on the electrode layer 22 to cover the surface of the electrode layer 22. The material of the passivation layer 23 may be similar to, the same as or different from the material of the passivation layer 17. For example, the passivation layer 23 may include a non-metal material, such as a dielectric material, such as aluminum nitride, silicon nitride, the like, or combinations thereof.

Referring to FIG. 1S to FIG. 1T, a patterning process is performed on the passivation layer 23 and the electrode layer 22, so as to form an electrode 22a and a passivation layer 23a constituting a second electrode structure. The patterning process may include photolithography and etching processes. Referring to FIG. 1T, after the patterning process, the electrode 22a and the passivation layer 23a expose a portion of the top surface of the piezoelectric layer 10c, and have sidewalls S1 substantially aligned with each other. In some embodiments, the sidewall S1 of the second electrode structure is substantially aligned with the inner sidewall S2 of the edge protrusion layer 16a (i.e., the inner edge of the edge protrusion structure). The electrode 22a is partially overlapped with the electrode 12a in a direction perpendicular to the surface (e.g., the top surface) of the piezoelectric layer 10c. In some embodiments, the electrode 22a and the conductive layer 16a are partially overlapped with each other, and the overlapping area of the electrode 22a and the conductive layer 16a is smaller than the overlapping area of the electrode 22a and the electrode 12a.

Referring to FIG. 1U and FIG. 2A, a patterning process is performed on the piezoelectric layer 10c to form a through hole 24 and release holes 25 in the piezoelectric layer 10c (FIG. 2A). The patterning process includes, for example, performing an etching process on the piezoelectric layer 10c using a patterned mask layer as an etching mask, so as to remove portions of the piezoelectric layer 10c and form a through hole 24 extending through the piezoelectric layer 10c and exposing a portion of the surface of the electrode 12a and release holes 25 extending through the piezoelectric layer 10c and exposing a portion of the surface of the sacrificial dielectric part 18a. In the cross-sectional view, the sidewalls of the through hole 24 and the release hole 25 (referring to FIG. 1Y) may be inclined or straight, that is, the cross-sectional shape of the through hole 24 and the release hole 25 may be trapezoidal or square; in plan view, the shape of the through hole 24 may be rectangle, rectangle with rounded corners or any other suitable shape, and the shape of the release hole 25 is, for example, ellipse, circle or any other suitable shape. It should be understood that the above-described shapes of the through hole and the release hole are merely for illustration, and the present disclosure is not limited thereto. In some embodiments, one or multiple release holes 25 may be formed in the piezoelectric layer 10c, and the present disclosure does not limit the number of release hole(s) 25.

Referring to FIG. 1V, a patterning process is performed on the passivation layer 23a to form a via hole 26 extending through the passivation layer 23a and exposing a portion of the surface of the electrode 22a. The patterning process may include performing an etching process on the passivation layer 23a using a patterned mask layer as an etching mask.

Referring to FIG. 1W, a connector 27 and a connector 28 are respectively formed to fill in the through hole 24 and the through hole 26. The connector 27 and the connector 28 extend through the through hole 24 and the through hole 26 to be electrically connected to the electrode 12a and the electrode 22a, respectively. Portions of the electrode 12a and the electrode 22a that are connected to the connectors (or may be referred to as external connectors) 27 and 28 may also be referred to as electrode lead-out parts (e.g., referred to as a first electrode lead-out part and a second electrode lead-out part, respectively). In some embodiments, the connector 27 partially fills (or may completely fill) the through hole 24 and protrudes above the top surface of piezoelectric layer 10c. For example, the connector 27 includes a conductive via portion located in the through hole 24 and a protruding part (such as a pad portion) located outside the through hole 24 and extending along the top surface of the piezoelectric layer 10c. Similarly, the connector 28 completely fills (or may partially fill) the through hole 26 and protrudes above the top surface of passivation layer 23a. For example, the connector 28 includes a conductive via portion located in the through hole 26 and a protruding part (such as a pad portion) outside the through hole 26 and extending along the top surface of passivation layer 23a. The connectors 27 and 28 include conductive materials such as metal materials, such as aluminum, copper, gold, titanium, tungsten, platinum, the like, alloys thereof, or combinations thereof.

In some embodiments, the forming method of the connectors 27 and 28 may include the following processes: a seed layer (not shown), for example, including titanium/copper, may be formed over the substrate 20 by sputtering; the seed layer extends along the surface of the passivation layer 23a, the sidewall S1 of the electrode 22a, and the surface of the piezoelectric layer 10c, and fills into the through holes 24 and 26 and the release holes 25; a patterned mask layer is then formed on the seed layer to cover portions of the surfaces of the passivation layer 23a and the piezoelectric layer 10c, the sidewall S1 of the electrode 22a and the seed layer in the release holes 25, and the patterned mask layer has openings corresponding to the positions where the connectors 27 and 28 are to be formed, that is, the patterned mask layer exposes the through holes 24 and 26 and portions of the top surfaces of the passivation layer 23a and the piezoelectric layer 10c adjacent to the through holes 24 and 26; thereafter, a conductive layer (e.g., copper) is formed on the seed layer exposed by the openings of the patterned mask layer; the patterned mask layer is removed, and portions of the seed layer not covered by the conductive layer is removed using the conductive layer as an etching mask, and the conductive layer and the remaining seed layer underlying thereof constitute the connectors 27 and 28.

In the above-described embodiment, the release holes 25 are formed along with the through hole 24 by a same one patterning process before forming the connectors 27/28, but the present disclosure is not limited thereto. In some alternative embodiments, the release holes 25 may also be formed by a separate patterning process after forming the connectors 27/28.

Referring to FIG. 1W and FIG. 1X and FIG. 2A to FIG. 2B, the sacrificial dielectric part 18a of the dielectric layer 18 surrounded by the boundary layer 19 and the sacrificial dielectric layer 15 are removed to form a cavity (or may be referred to as a resonant cavity) 30. In some embodiments, the forming method of the cavity 30 includes, for example, removing the sacrificial dielectric part 18a and the sacrificial dielectric layer 15 through an etching process. The etching process includes, for example, a wet etching process, and alternatively or additionally includes a dry etching process. For example, the etchant enters into the region where the to-be-removed sacrificial dielectric part 18a and sacrificial dielectric layer 15 are located through the release holes 25, so as to remove the sacrificial dielectric part 18a and the sacrificial dielectric layer 15. Since the materials of the sacrificial dielectric part 18a and the sacrificial dielectric layer 15 are the same or similar, there is no or a lower etching selectivity ratio therebetween, and a same etchant can be used for etching the sacrificial dielectric part 18a and the sacrificial dielectric layer 15.

The resonant cavity 30 includes a cavity 30a formed at the position previously occupied by the sacrificial dielectric part 18a through removing the sacrificial dielectric part 18a and a void 30b formed at the position previously occupied by the sacrificial dielectric layer 15 through removing the sacrificial dielectric layer 15. In some embodiments, the cavity 30a is in spatial communication with the void 30b, the cavity 30a is surrounded by the boundary layer 19, the piezoelectric layer 10c, and the first electrode structure, and is located between the boundary layer 19 and the piezoelectric layer 10c and between the boundary layer 19 and the first electrode structure, and the void 30b is located between the intermediate dielectric layer 13 and the edge protrusion layer 16 in the first electrode structure.

Referring to FIG. 1X, as such, the resonator 100 is thus formed. The resonator 100 is a bulk acoustic wave resonator. In some embodiments, the resonator 100 includes the substrate (or may be referred to as a carrier substrate) 20, the bonding layer BL, the boundary layer 19, the periphery dielectric part 18b of the dielectric layer 18 (or may be referred to as a periphery dielectric layer 18b), the piezoelectric layer 10c, the resonant cavity 30, the first electrode structure ES1 and the second electrode structure ES2 on opposite sides of the piezoelectric layer 10c, and the connector 27 and the connector 28 respectively connected to the first electrode structure ES1 and the second electrode structure ES2. In some embodiments, the piezoelectric layer 10c, the first electrode structure ES1, the second electrode structure ES2, the connectors 27 and 28 constitute the bulk acoustic resonant structure; the boundary layer 19, the bonding layer BL, the periphery dielectric layer 18b and the substrate 20 constitute a resonant carrier. The resonant cavity 30 is defined between the resonant carrier and the resonant structure and has a profile defined by the boundary layer 19 in the first direction D1.

In some embodiments, the first electrode structure ES1 is constituted by the electrode 12a, the intermediate dielectric layer 13, the edge protrusion layer 16a, and the passivation layer 17. The intermediate dielectric layer 13 may also be referred to as a first passivation layer, and the passivation layer 17 may also be referred to as a second passivation layer, the edge protrusion layer 16a and the passivation layer 17 constitute the edge protrusion structure and are disposed along the edge of the electrode 12a, a portion of the edge protrusion layer 16a is in contact with the electrode 12a (e.g., in contact with an end including the electrode lead-out part of the electrode 12a). The void 30b may be disposed between the edge protrusion structure and the intermediate dielectric layer 13. In some embodiments, the second electrode structure ES2 is constituted by the electrode 12a and the passivation layer 23a. In some other embodiments, the second electrode structure ES2 may also have an edge protrusion structure similar to that of the first electrode structure ES2. The first electrode structure ES1 may also be referred to as a lower electrode structure, and the electrode 12a may also be referred to as a first electrode or a lower electrode; the second electrode structure ES2 may also be referred to as an upper electrode structure, and the electrode 22a may also be referred to as a second electrode or an upper electrode, and vice versa. The first electrode structure ES1 is located on a side (e.g., a first side) of the piezoelectric layer 10c away from the second electrode structure ES2, and the second electrode structure ES2 is located on a side (e.g., a second side) of the piezoelectric layer 10c away from the first electrode structure ES1, the second side and the first side are opposite to each other in a direction perpendicular to the surface (e.g., the top surface) of the piezoelectric layer

10c. The first electrode structure ES1, the second electrode structure ES2 and the cavity 30 are partially overlapped with each other in a direction perpendicular to the top surface of the piezoelectric layer 10c.

Referring to FIG. 1X, FIG. 1Y and FIG. 2B, for the sake of brevity, the first electrode 12a and the second electrode 22a are shown in FIG. 2B to represent the first electrode structure and the second electrode structure. In some embodiments, the first electrode structure ES1 has a portion (e.g., a body part BP1) located in the cavity 30a, and has a portion (e.g., an extending part EP1) extending into the periphery dielectric layer 18b; the extending part EP1 may be or may include a first electrode lead-out part connected to the connector 27, and the extending part EP1 may also be partially located in the cavity 30 and extend from the cavity 30 to the periphery dielectric layer 18b. A portion (e.g., body part BP2) of the second electrode structure ES2 overlaps with the body part EP1 of the first electrode structure ES1 and the cavity 30 in a direction perpendicular to the top surface of the piezoelectric layer 10c, and another portion (e.g., an extending part EP2 which may be or include the second electrode lead-out part) of the second electrode structure ES2 is not overlapped with the first electrode structure ES1 in a direction perpendicular to the top surface of the piezoelectric layer 10c; the extending part EP2 may be partially overlapped with the cavity 30, or may be not overlapped with the cavity 30. Referring to FIG. 2B, for example, in some embodiments, the body part BP1 of the first electrode 12a (or the first electrode structure) and the body part BP2 of the second electrode 22a (or the second electrode structure) are overlapped with each other, and the extending part EP1 of the first electrode 12a and the extending part EP2 of the second electrode 22a respectively extend and protrude toward different horizontal directions from their respective body parts BP1/BP2. The body part BP1 of the first electrode 12a is, for example, in a shape of pentagon, and the extending part EP1 of the first electrode 12a is, for example, in a shape of rectangle; the body part BP2 of the second electrode 22a is, for example, in a shape of pentagon, and the extending part EP2 of the second electrode 22a is, for example, in a shape of rectangle, but the present disclosure is not limited thereto, and the first electrode 12a and the second electrode 22a may have any suitable shapes.

It should be noted that, in FIG. 2B, dotted lines are respectively shown between the respective body parts and the extending parts in the first electrode 12a and the second electrode 22a, to separate the body parts and the extending parts, which should be understood that, the dotted lines are only used to illustrate the body parts and the extending parts of the electrodes more clearly, and does not limit that the body parts and the extending parts of the electrodes have obvious interfaces therebetween. In some embodiments, the first electrode 12a and the second electrode 22a are continuous layers and do not have obvious interfaces between their respective body parts and extending parts, respectively. In addition, for the clarity of the drawing, in FIG. 2B, the edges of the body parts of the first electrode 12a and the second electrode 22a are shown as being not aligned, but the present disclosure is not limited thereto. In some embodiments, for example, as shown in FIG. 1Y, the edges of the body parts of the first electrode structure ES1 and the second electrode structure ES2 are aligned with each other in a direction perpendicular to the piezoelectric layer 10c. In some embodiments, for example, as shown in FIG. 1X, the sidewall S1 of the second electrode structure ES2 close to the extending part EP1 of the first electrode structure ES1 (i.e., close to the first electrode lead-out part) and the inner sidewall (or referred to as inner edge) S2 of the edge protrusion structure of the first electrode structure ES1 are aligned with each other in a direction perpendicular to the piezoelectric layer 10c. Such an arrangement of the edge protrusion structure can improve the quality factor of the resonator, as well as avoiding the parasitic resonance from being generated in the region overlapping with the edge protrusion structure, thereby improving the performance of the bulk acoustic wave resonator.

Referring to FIG. 1X, the bonding layer BL is located on the side of the boundary layer 19 away from the cavity 30, and is located between the boundary layer 19 and the substrate 20. In some embodiments, the bonding layer BL has a body part BL1 extending along the first direction D1 and covering the top surface of the substrate 20, and a protrusion part (or referred to as a bonding protrusion part) BL2 protruding from the body part (or referred to as a bonding body part) BL1 in the second direction D2. The first direction D1 is, for example, parallel to the top surface of the substrate 20 or the top surface of the piezoelectric layer 10c, and the second direction D2 intersects the first direction D1, for example, the second direction D2 is substantially perpendicular to the first direction D1. That is to say, the protrusion part BL2 protrudes from the top surface of the body part BL1 away from the substrate 20 in a direction perpendicular to the top surface of the substrate 20. In some embodiments, the protrusion part BL2 includes a plurality of portions having different protrusion heights. For example, a portion of the protrusion part BL2 (e.g., a first portion, located on the left side in FIG. 1X) is located between the body part BL1 and the piezoelectric layer 10c, while another portion of the protrusion part BL2 (e.g., a second portion, located on the right side in FIG. 1X) is located between the body part BL1 and the first electrode structure ES1, and the protrusion height of the first portion of the protrusion part BL2 is larger than the protrusion height of the second portion of the protrusion part BL2. Herein, the protrusion height of the protrusion part BL2 refers to the vertical distance in the second direction D2 from the top surface of the protrusion part BL2 to the top surface of the body part BL1.

The boundary layer 19 extends along the surface of the bonding layer BL1 (i.e., the top surface of the body part BL1, the top surface and sidewalls of the protrusion part BL2), and has a horizontally extending part 19a that extends along the top surface of the bonding body part BL1 in the first direction D1, and a protrusion part (or referred to as a boundary protrusion part) 19b extending along the top surface and sidewalls of the protrusion part BL2 of the bonding layer BL. The protrusion part 19b protrudes from the horizontally extending part 19a away from the substrate 20 in the second direction D2. It should be understood that, the bonding protrusion part BL2 and the boundary protrusion part 19b are the portions of the bonding layer BL and the boundary layer 19 that are filled in the trench TH of the dielectric layer 18 during the manufacturing process.

Still referring to FIG. 1X, the periphery dielectric layer 18b is located between the horizontally extending part 19a of the boundary layer 19 and the piezoelectric layer 10c and outside the boundary protrusion part 19b, that is, located on the side of the boundary protrusion part 19b away from the cavity 30 in the horizontal direction (e.g., the first direction D1). The boundary protrusion part 19b includes a top portion P1 covering the top surface of the bonding protrusion part BL2 and located between the top surface of the bonding protrusion part BL2 and the piezoelectric layer 10c, an outer side portion P2a covering the outer sidewall of bonding protrusion part BL2 and sandwiched between the outer sidewall of the bonding protrusion part BL2 and the periphery dielectric layer 18b, and an inner side portion P2b covering the inner sidewall of the bonding protrusion part BL2 and opposite to the outer side portion P2a. Herein, the outer sidewall of the bonding protrusion part BL2 and the outer side portion of the boundary protrusion 19b refer to their sidewall/portion facing the periphery dielectric layer 18b, respectively, and the inner sidewall of the bonding protrusion part BL2 and the inner side portion of the boundary protrusion part 19b refer to their sidewall/portion opposite to the above-described outer sidewall/outer side portion and facing the cavity 30, respectively. In some embodiments, such a structure of the boundary layer 19 including the outer side portion P2a and the inner side portion P2b is referred to as a dual-wall structure.

In some embodiments, the boundary protrusion part 19b includes portions having different protrusion heights. For example, a portion (e.g., a first portion, located on the left side of FIG. 1X) of the boundary protrusion part 19b overlies the first portion of the bonding protrusion part BL2 and is in contact with the piezoelectric layer 10c; another portion (e.g., a second portion, located on the right side of FIG. 1X) of the boundary protrusion part 19b overlies the second portion of the bonding protrusion part BL2, and is in contact with the passivation layer 17 of the first electrode structure; the protrusion height of the first portion of the boundary protrusion part 19b is higher than the protrusion height of the second portion thereof. Herein, the protrusion height of the boundary protrusion part 19b refers to the vertical height from the top surface of the horizontally extending part 19a (or the bottom surface of the horizontally extending part or the top surface of the substrate) to the top surface of the boundary protrusion part 19b in the second direction D2. In other words, the top surface of the first portion of the boundary protrusion part 19b is higher than the top surface of the second portion thereof. In some embodiments, the top surface of the first portion of the boundary protrusion part 19b is substantially level with the top surface of the periphery dielectric layer 18b.

Referring to FIG. 1X and FIG. 2B, the boundary protrusion part 19b and the bonding protrusion part BL2 laterally surround the cavity 30 in the first direction D1; the periphery dielectric layer 18b laterally surrounds the boundary protrusion part 19b and the bonding protrusion part BL2 in the first direction D1 and is spaced apart from the cavity 30. In some embodiments, the inner side portion P2b of the boundary protrusion part 19b (e.g., the inner sidewall IS thereof) and the horizontally extending part 19a (e.g., top surface thereof) located between the inner side portions P2b, the piezoelectric layer 10c (e.g., the bottom surface thereof), and the first electrode structure ES1 define the cavity 30. In other words, the inner sidewall IS of the inner side portion P2b of the boundary protrusion part 10b, the top surface of the horizontally extending part 19a located between the inner side portions P2b, and a portion of the bottom surface of the piezoelectric layer 10c are exposed in the cavity 30. In some embodiments, as shown in FIG. 2B, the cavity 30 includes, for example, a body cavity part R1 and protruding cavity parts R2 laterally protruding from the body cavity part R1 in the horizontal direction. For example, in the plan view, the body cavity portion R1 is, for example, in a shape of pentagon, and the protruding cavity portion R2 protrudes from a side of the body cavity part R1, and is, for example, in a shape of rectangle. However, the above-described shape of the cavity 30 is merely for illustration, and the present disclosure is not limited thereto. In some other embodiments, the cavity 30 may be disposed in any suitable shape according to the product requirement.

Referring to FIG. 1Y and FIG. 2B, in some embodiments, the piezoelectric layer 10c has the release holes 25. The release holes 25 extend through the piezoelectric layer 10c and are in spatial communication with the cavity 30. For example, the release holes 25 are located above the protruding cavity parts R2 of the cavity 30, and are overlapped with and in spatial communication with the protruding cavity parts R2.

FIG. 3A to FIG. 3E are schematic cross-sectional views illustrating various stages in a manufacturing method of a bulk acoustic wave resonator according to some other embodiments of the present disclosure.

Figure 3:
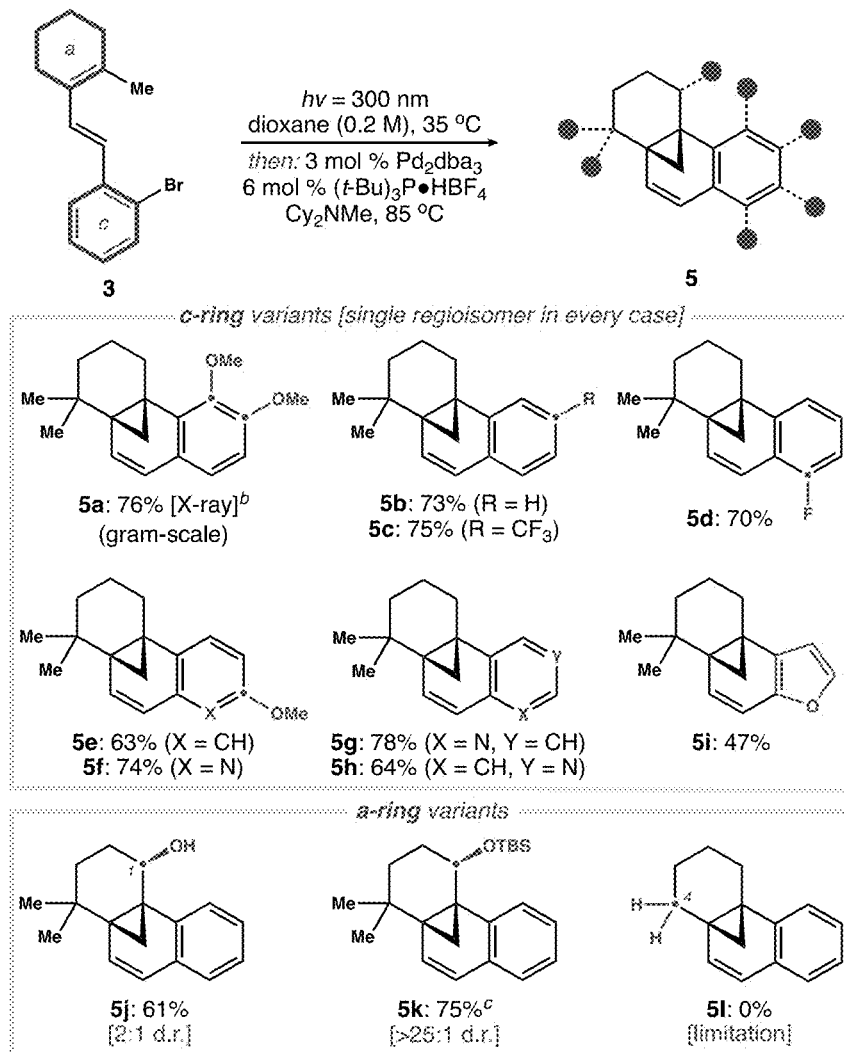
FIG. 3A to FIG. 3E are schematic cross-sectional views illustrating various stages in a manufacturing method of a bulk acoustic wave resonator according to some other embodiments of the present disclosure.
Figure 3A:
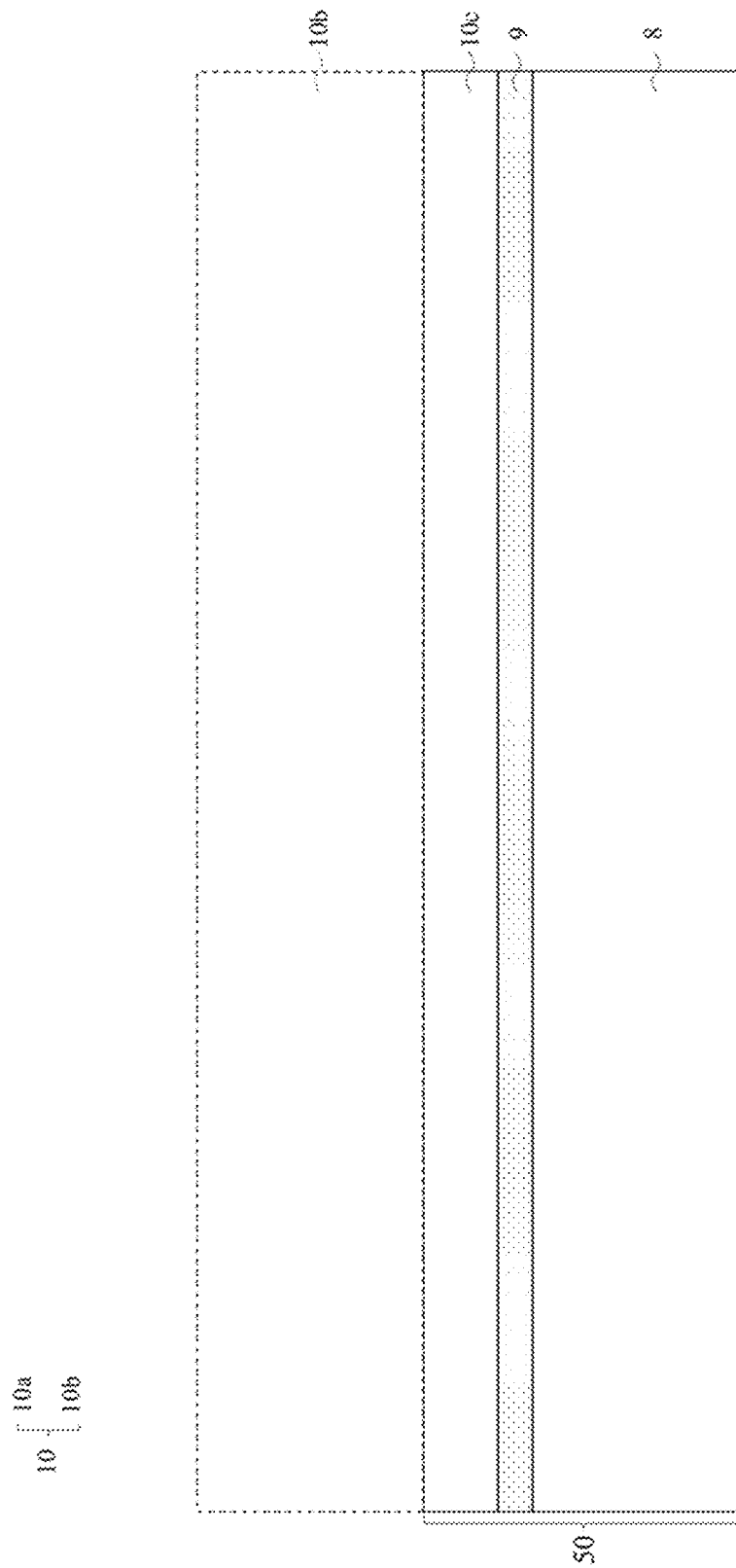

Referring to FIG. 3A, a substrate structure 50 is provided. The substrate structure 50 is a piezoelectric substrate structure including a piezoelectric layer 10c. In some embodiments, the substrate structure 50 is a piezoelectric-on-insulator (POI) substrate, such as a POI wafer. The substrate structure 50 includes a substrate 8, an insulating layer 9 and the piezoelectric layer 10c from bottom to top. For example, the substrate 8 is a semiconductor substrate, such as a silicon substrate or a silicon-containing substrate, or may include other suitable semiconductor materials; the insulating layer 9 includes an insulating material such as silicon oxide ($SiO_2$), the insulating layer 9 may be a single-layer or multi-layer structure. The material of the piezoelectric layer 10c is similar to or the same as the material of the piezoelectric layer 10c in the above-described embodiment, and details are not described again here. The thickness of the piezoelectric layer 10c ranges from, for example, 0.2 μm to 3 μm, but the present disclosure is not limited thereto.

In some embodiments, the forming method of the substrate structure 50 includes the following processes: a substrate 8 and a piezoelectric substrate 10 are provided, and the substrate 8 and the piezoelectric substrate 10 may be respectively formed by crystal pulling processes, for example; thereafter, insulating layers (or referred to as bonding insulating layers or bonding dielectric layers) are formed on the surfaces of the substrate 8 and the piezoelectric substrate, respectively, and the insulating layer on the substrate 8 and insulating layer on the piezoelectric substrate 10 are bonded together by, for example, a fusion bonding process to form an insulating layer (or referred to as a bonding layer) 9, and the substrate 8 and the piezoelectric substrate 10 are bonded together through the insulating layer 9 therebetween; thereafter, in some embodiments, a grinding process (e.g., CMP) is performed from a side of the piezoelectric substrate away from the substrate 8, so as to remove a portion of the piezoelectric substrate (e.g., the removed portion 10b shown in dotted line in FIG. 3A), and form a piezoelectric layer 10c with a required thickness. In some other embodiments, the portion 10b of the piezoelectric substrate 10 may be removed by defining a cleavage plane in the piezoelectric substrate 10 and then splitting the piezoelectric substrate 10 along the cleavage plane. The splitting process is similar to the splitting process described in the previous embodiment. For example, hydrogen or helium ions are implanted into the piezoelectric substrate 10 by an ion implantation process before the piezoelectric substrate 10 is bonded to the substrate 8, so as to define a cleavage plane in the piezoelectric substrate 10, and after the piezoelectric substrate 10 is bonded to the substrate 8, an annealing process is performed on the piezoelectric substrate 10, such that the piezoelectric substrate 10 is split along the cleavage plane, and the portion 10b of the piezoelectric substrate is removed. In some embodiments, after the splitting process, a planarization process may be further performed on the remaining portion of the piezoelectric substrate, such that the formed piezoelectric layer 10c has a flat top surface and is substantially free of cleavage ions. In some embodiments, the above process step of removing the portion 10b of the piezoelectric substrate 10 may also be referred to as a thinning process of the piezoelectric substrate 10.

Figure 3B:
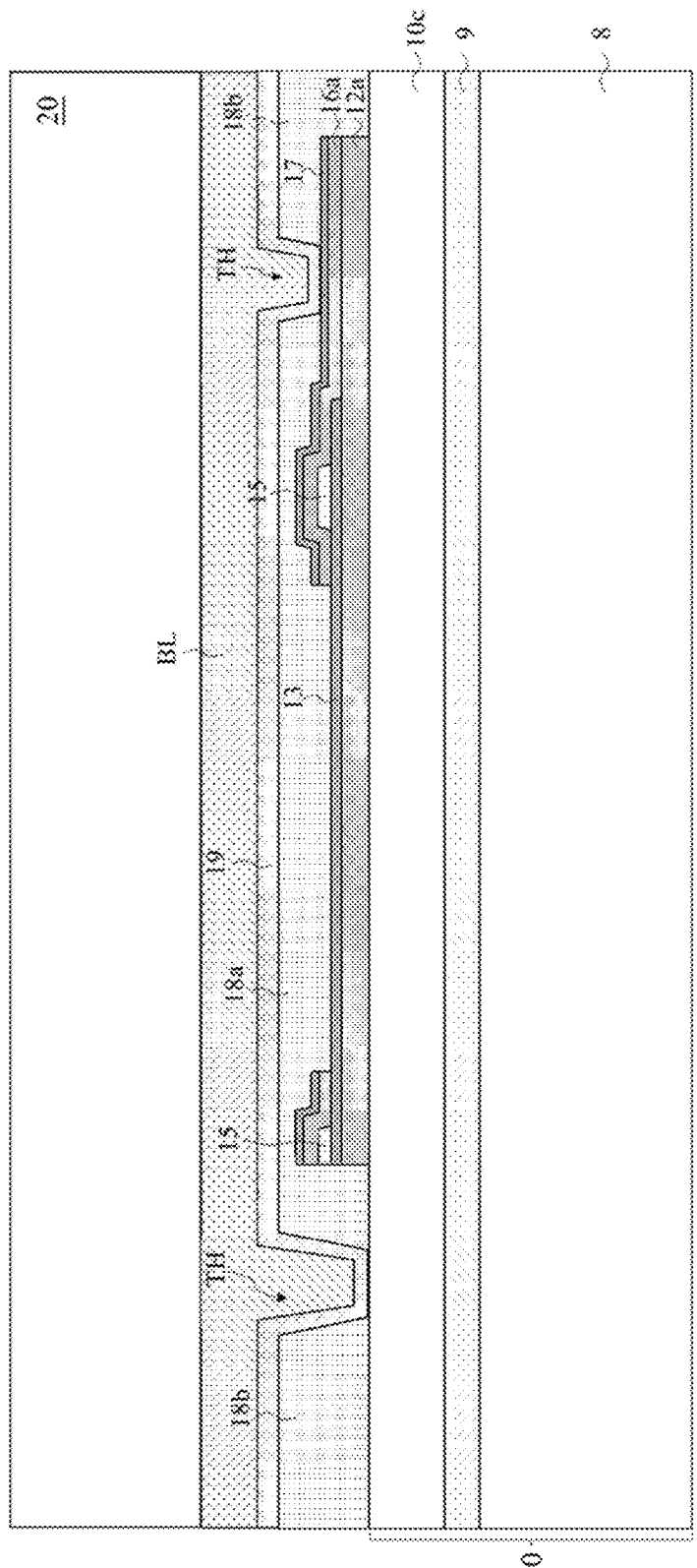

Referring to FIG. 3B, the process steps described above with reference to FIG. 1C to FIG. 1P are then performed, so as to form a first electrode structure, a dielectric layer 18 including a sacrificial dielectric part 18a and a periphery dielectric part 18b, a boundary layer 19, a bonding layer BL over the substrate structure 50, and the substrate 20 is bonded over the substrate structure 50 through the bonding layer BL. The above process steps are similar to those described in the foregoing embodiments, which are not described again here.

Figure 3C:
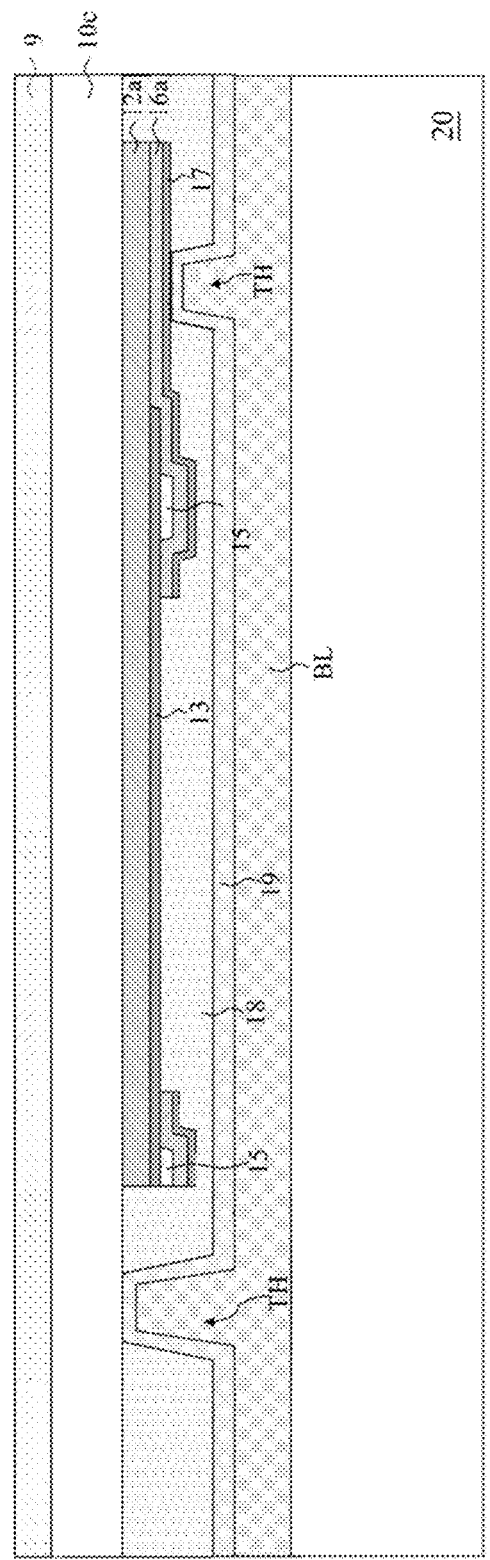

Referring to FIG. 3B to FIG. 3C, the structure shown in FIG. 3B is turned over, and the substrate 8 is removed to expose the insulating layer 9. In some embodiments, the substrate 8 is removed by a grinding process such as CMP, and the insulating layer 9 may serve as a stop layer for the grinding process.

Figure 3D:
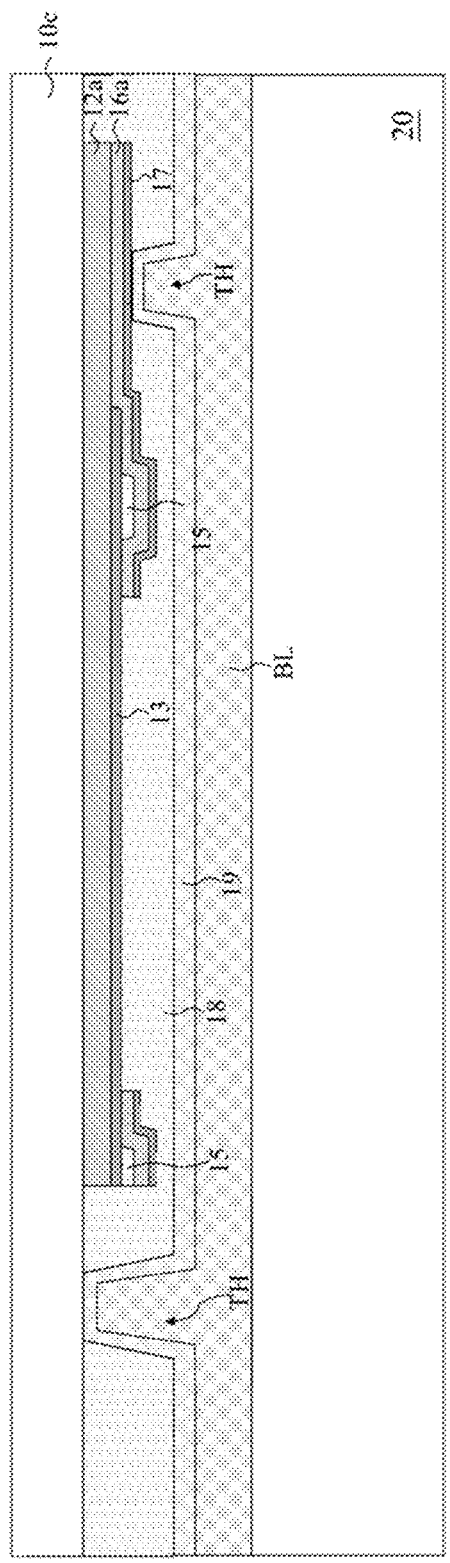

Referring to FIG. 3C to FIG. 3D, the insulating layer 9 is removed to expose the piezoelectric layer 10c. In some embodiments, the insulating layer 9 may be removed by a polishing process (such as CMP) and/or an etching process. After the insulating layer 9 is removed and the piezoelectric layer 10c is exposed, a thickness measurement of the piezoelectric layer 10c may be optionally performed to ensure that the piezoelectric layer 10c has a required thickness. In some embodiments, an ion beam etching and/or ion beam trimming may be further performed on the piezoelectric layer 10c to remove a portion of the piezoelectric layer 10c, such that the thickness of the piezoelectric layer precisely achieve the required thickness and the thickness is more uniform.

Figure 3E:
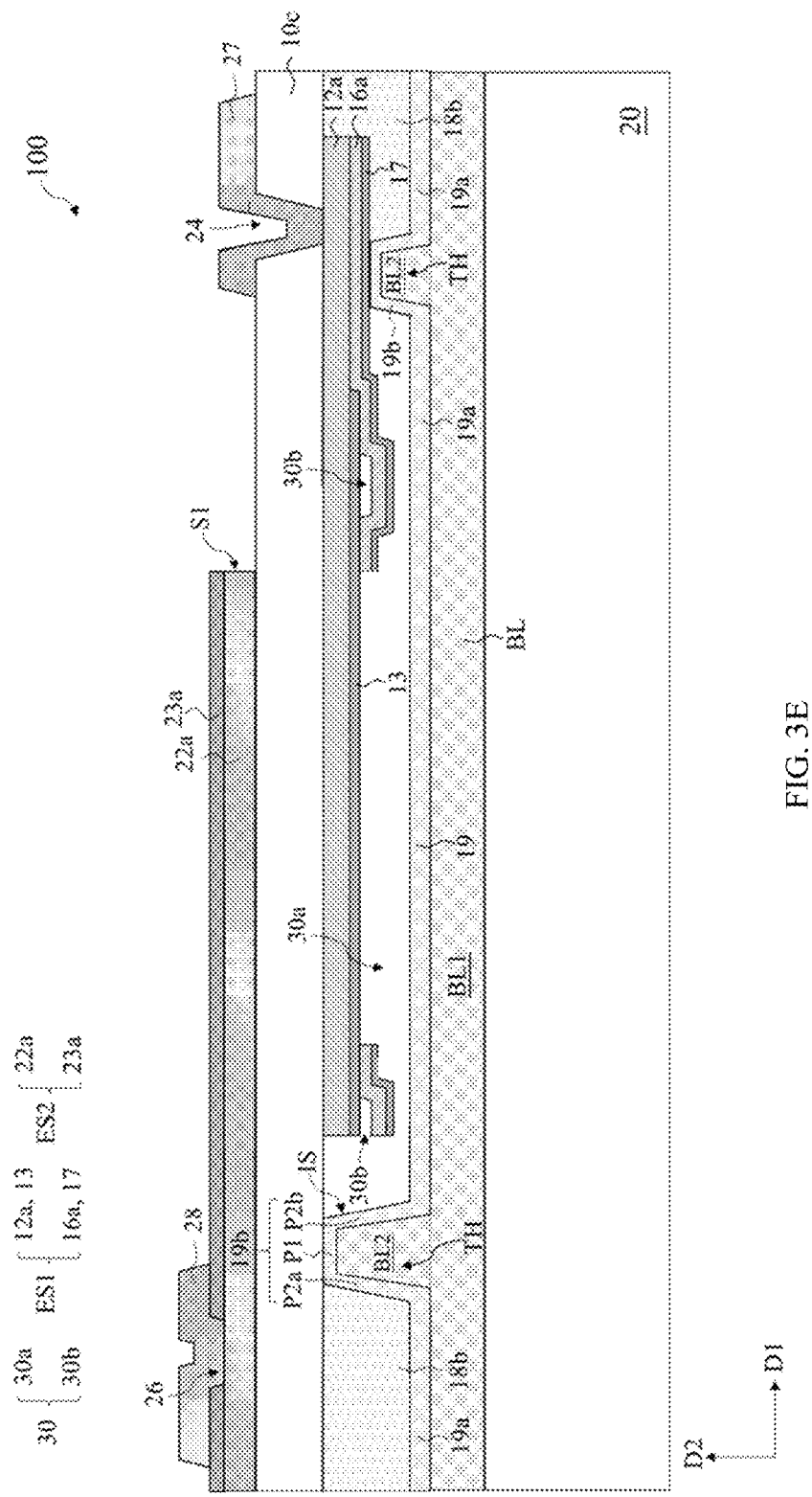

Referring to FIG. 3D to FIG. 3E, process steps similar to those described in FIG. 1S to FIG. 1X are then performed, so as to form a second electrode structure ES2 on the piezoelectric layer 10c, form the connector 27 and connector 28 respectively connected to the first electrode structure ES1 and the second electrode structures ES2, form release holes 25 (FIG. 2B) penetrating through the piezoelectric layer 10c, etch and remove the sacrificial dielectric part 18a and the sacrificial dielectric layer 15 to form a cavity 30. The above process steps are similar to those described in the foregoing embodiments, which are not described again here.

Referring to FIG. 3E, as such, the resonator 100 is thus formed. The structural features of the resonator 100 are substantially similar to those of the resonator described in the above embodiment, and are not described herein again.

FIG. 4A to FIG. 4E are schematic cross-sectional views illustrating various stages in a manufacturing method of a bulk acoustic wave resonator according to some other embodiments of the present disclosure.

Figure 4:
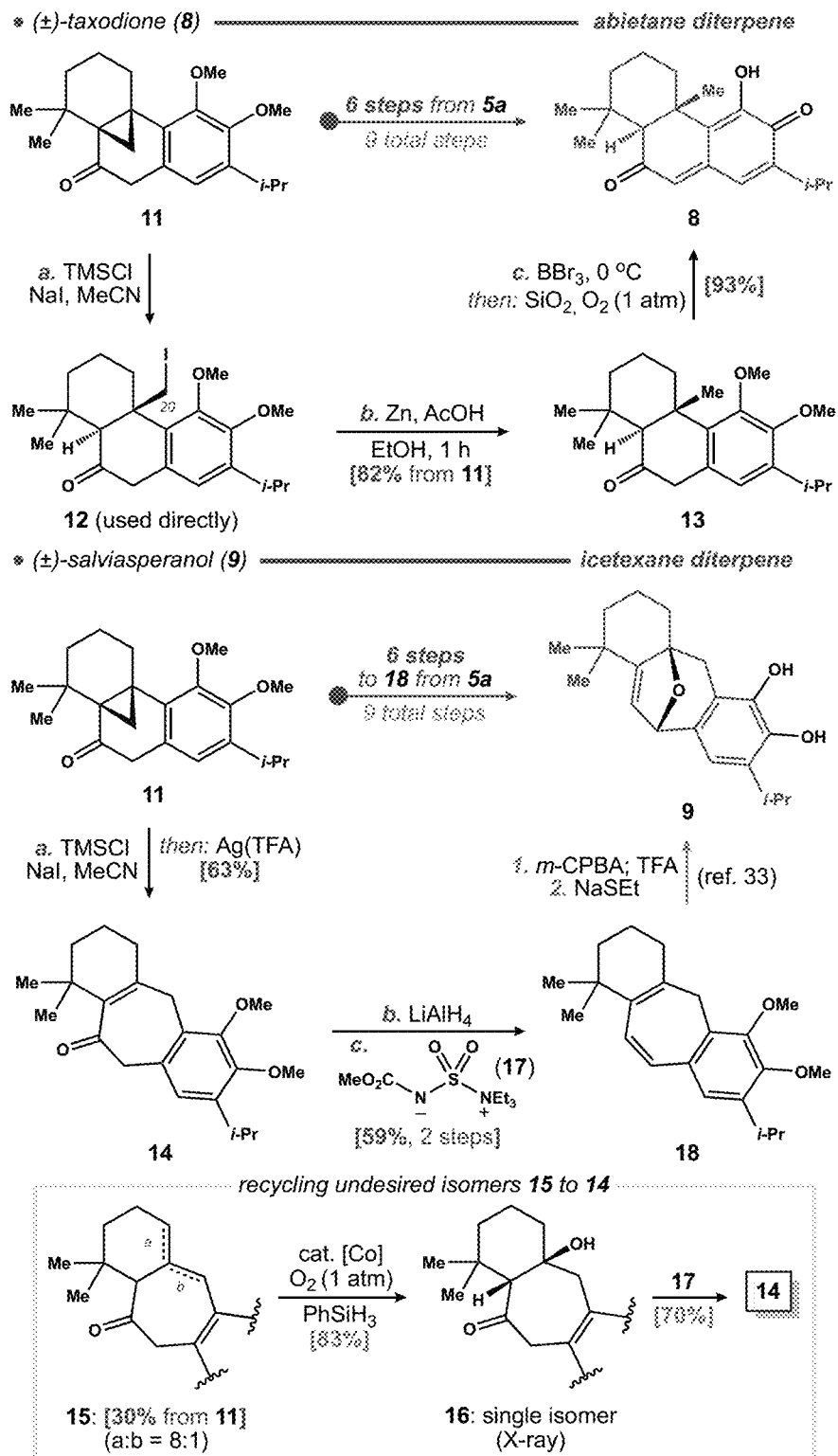
FIG. 4A to FIG. 4E are schematic cross-sectional views illustrating various stages in a manufacturing method of a bulk acoustic wave resonator according to some other embodiments of the present disclosure.
Figure 4A:
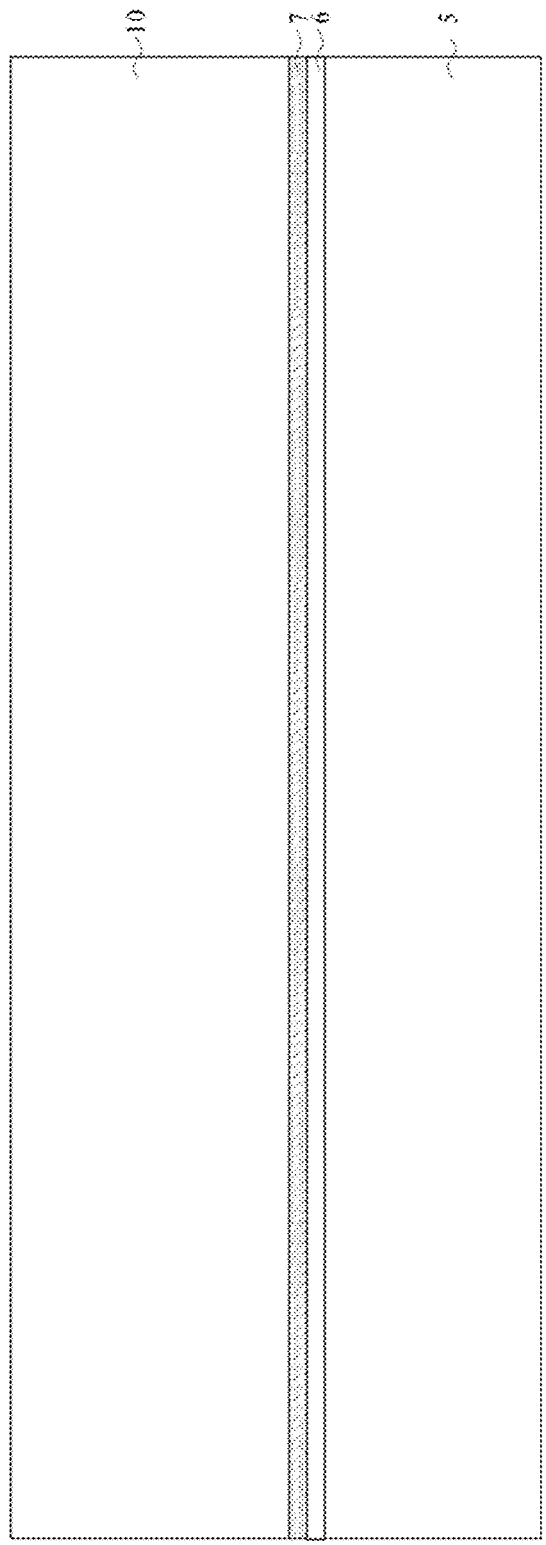

Referring to FIG. 4A, a substrate 5 is provided. In some embodiments, the substrate 5 may also be referred to as a carrier, such as a temporary carrier which is to be removed in a subsequent process step, and may be a glass carrier, ceramic carrier or the like. The present disclosure does not limit the material of the substrate, and the substrate 5 may use any material that can provide structural support for the overlying structure in the subsequent processes. In some embodiments, the substrate 5 has a release layer 6 formed thereon, and the release layer 6 is formed by, for example, a spin coating method. In some embodiments, the release layer 6 may be formed of an adhesive such as Ultra-Violet (UV) glue, Light-to-Heat Conversion (LTHC) glue, or other types of adhesives. In the subsequent process, the release layer 6 can be decomposed under the heat of light and lose or reduce the adhesiveness, thereby releasing the substrate 5 from the overlying structure to be formed in the subsequent steps.

In some embodiments, the piezoelectric substrate 10 is bonded to the substrate 5 through a bonding layer 7. The material and forming method of the piezoelectric substrate 10 are similar to those described in the foregoing embodiments, and are not described again here. For example, the bonding layer 7 may include an adhesive layer, and the piezoelectric substrate 10 is attached to the substrate 5 through the adhesive layer. The adhesive layer is, for example, a wafer attach film, silver paste or the like.

In some embodiments, the bonding layer 7 includes a dielectric material such as silicon oxide, for example, a first bonding dielectric material and a second bonding dielectric material are respectively formed on the substrate 5 with the release layer 6 and the piezoelectric substrate 10, thereafter, a bonding process is performed to bond the first bonding dielectric material and the second bonding dielectric material together and form the bonding layer 7, such that the piezoelectric substrate 10 is bonded to the substrate 5 through the bonding layer 7.

In some other embodiments, the bonding layer 7 includes a combination of a dielectric material (e.g., silicon oxide) and an adhesive layer. For example, a dielectric material layer may be formed on the substrate 5 with the release layer 6 by a suitable deposition process such as CVD or a spin coating method, and the piezoelectric substrate 10 is then attached to the dielectric material layer through the adhesive layer.

Figure 4B:
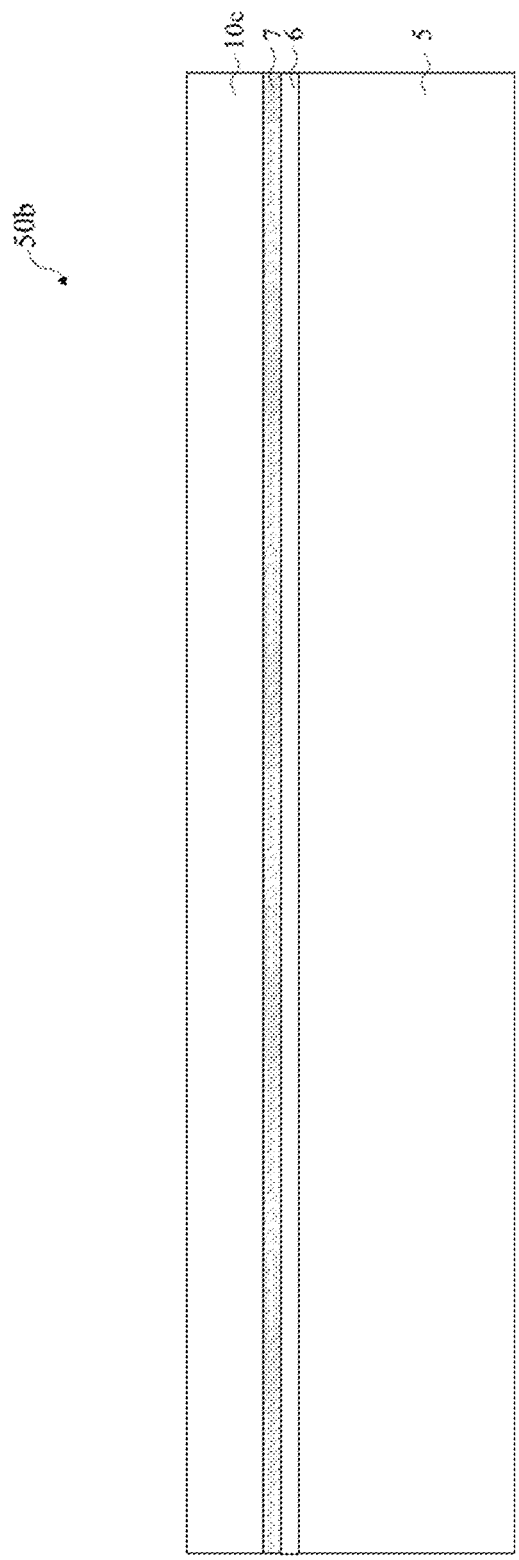

Referring to FIG. 4A to FIG. 4B, in some embodiments, a thinning process is performed on the piezoelectric substrate 10 to form a piezoelectric layer 10c having a required thickness. The thinning process includes, for example, a polishing process such as CMP. In some other embodiments, the thinning process includes the following processes: an ion implantation process is performed on the piezoelectric substrate 10, so as to implant cleavage ions such as hydrogen ions or helium ions into the piezoelectric substrate 10, and define a cleavage plane in the piezoelectric substrate 10, the ion implantation process may be performed, for example, before bonding the piezoelectric substrate 10 to the substrate 5, but the present disclosure is not limited thereto; after the piezoelectric substrate 10 is bonded to the substrate 5, an annealing process is performed on the piezoelectric substrate 10, such that the piezoelectric substrate is split along the cleavage plane, and a portion of the piezoelectric substrate 10 is removed and a piezoelectric layer 10c is formed. In some embodiments, after the annealing process, a planarization process may be further performed on the remaining portion of the piezoelectric substrate 10, such that the piezoelectric layer 10c has a flat surface, and hydrogen or helium ions that may remain in the piezoelectrical layer are removed, such that the piezoelectric layer 10c is substantially free of cleavage ions and has better piezoelectric performance. Referring to FIG. 4B, as such, the substrate 5, the release layer 6, the bonding layer 7, and the piezoelectric layer 10c constitute a piezoelectric substrate structure 50b.

Figure 4C:
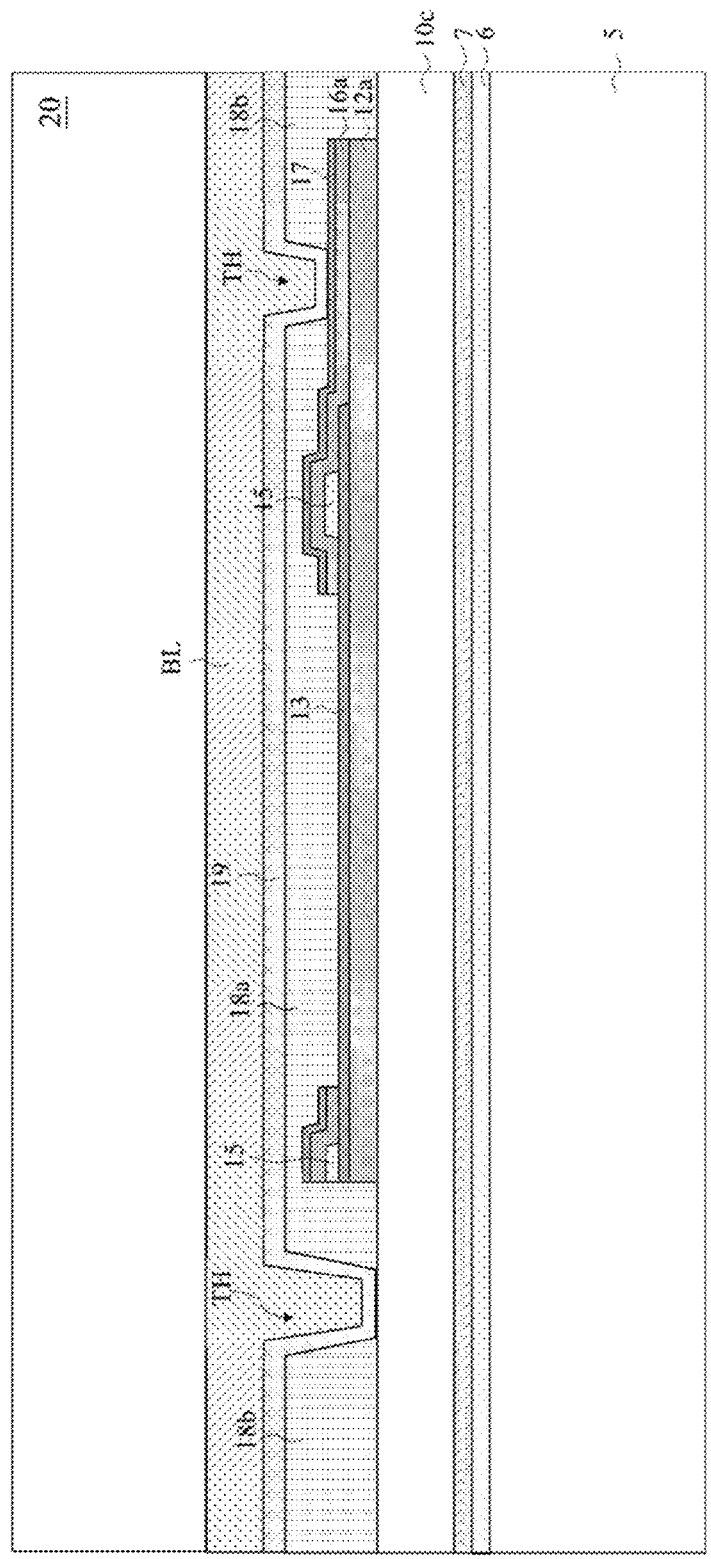

Referring to FIG. 4B to FIG. 4C, the process steps described above with reference to FIG. 1C to FIG. 1P are then performed, so as to form a first electrode structure, a dielectric layer 18 including a sacrificial dielectric part 18a and a periphery dielectric part 18b, a boundary layer 19, a bonding layer BL over the substrate structure 50b, and the substrate 20 is bonded over the substrate structure 50b through the bonding layer BL. The above process steps are similar to those described in the foregoing embodiments, which are not described again here.

Figure 4D:
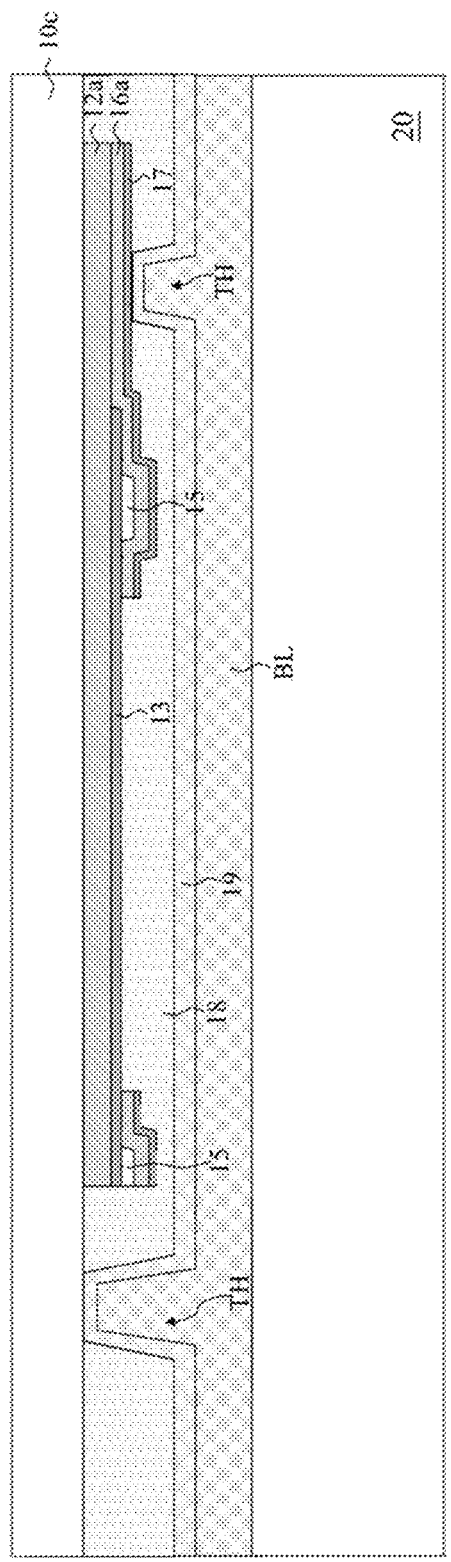

Referring to FIG. 4C to FIG. 4D, in some embodiments, the structure shown in FIG. 4C is turned over, and a light (e.g., UV light or laser) is irradiated on the release layer 6, such that the release layer 6 is decomposed under the heat of light and lose the adhesiveness, and the substrate 5 is released from the structure to which it attached, thereafter, the bonding layer 7 is removed to expose the surface of the piezoelectric layer 10c.

In some embodiments in which the bonding layer 7 includes an adhesive layer, the bonding layer 7 may be removed by mechanical force and a cleaning process. In some embodiments in which the bonding layer 7 includes a dielectric material layer, the dielectric material layer may be removed by an etching process. Similar to the foregoing embodiment, a thickness measurement of the piezoelectric layer 10c may be performed, and a portion of the piezoelectric layer 10c may be further removed, such that the piezoelectric layer 10c has the desired thickness.

Figure 4E:
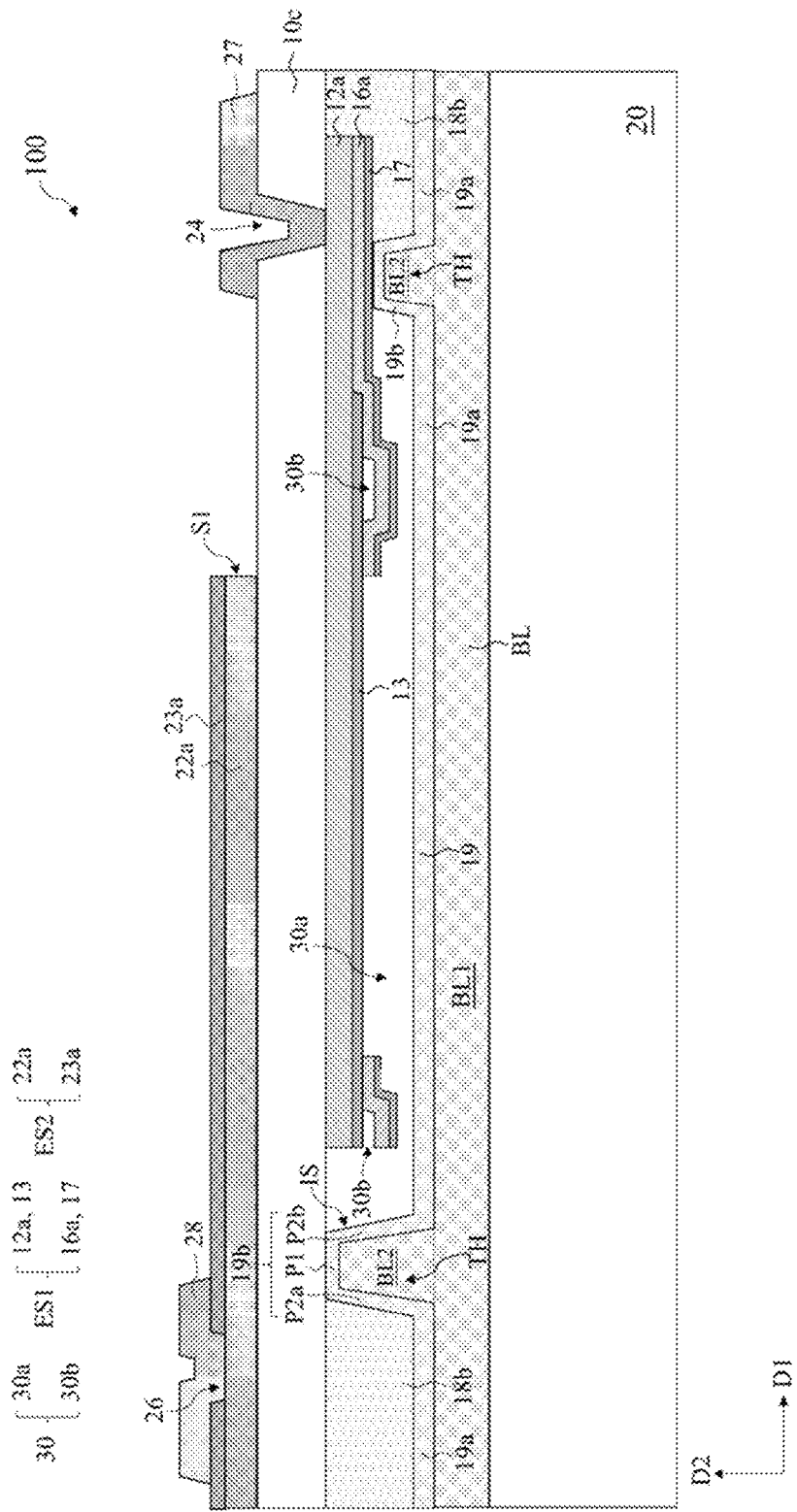
Figure 6:
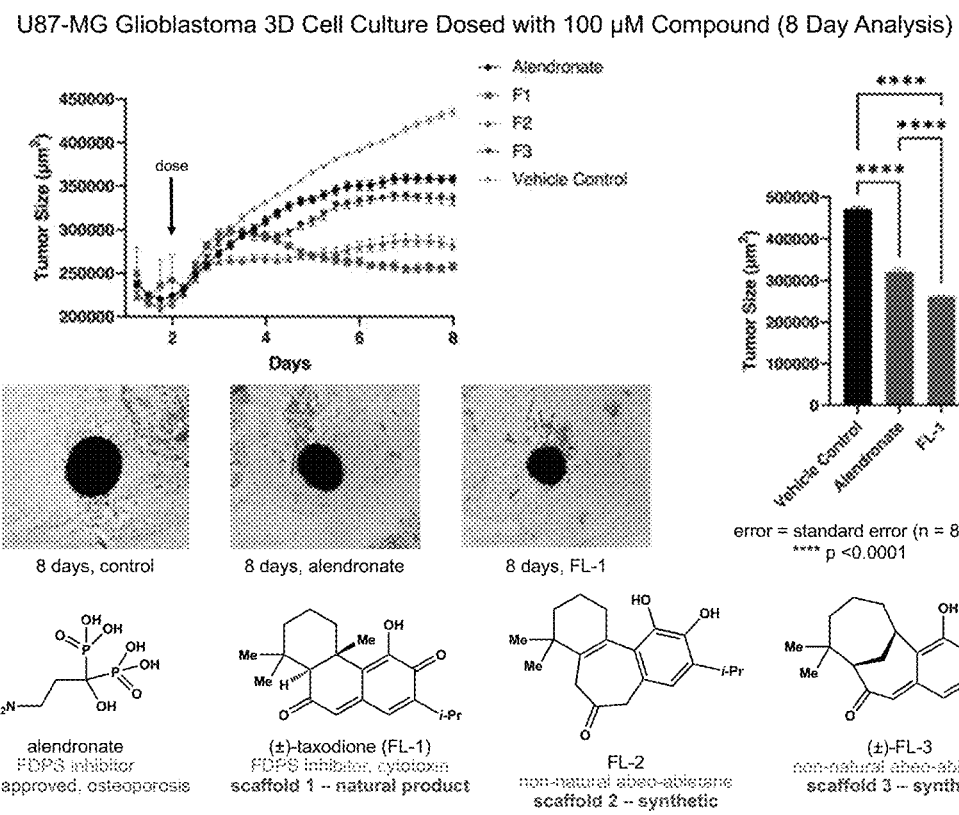

Referring to FIG. 4E, process steps similar to those described in FIG. 1S to FIG. 1x are then performed, so as to form a second electrode structure ES2 on the piezoelectric layer 10c, form a connector 27 and a connector 28 respectively connected to the first electrode structure ES1 and the second electrode structure ES2, form release holes 25 (FIG. 2B) penetrating through the piezoelectric layer 10c, etch and remove the sacrificial dielectric part 18a and the sacrificial dielectric layer 15 to form a cavity 30. The above process steps are similar to those described in the foregoing embodiments, which are not described again here.

In this embodiment, through forming the release layer 6 on the substrate 5, the grinding process for removing the substrate 5 can be omitted in the subsequent removal of the substrate 5, which can save the manufacturing cost.

In some embodiments of the present disclosure, the bulk acoustic wave resonators formed by the above-described embodiments may be used to form filters.

In the embodiments of the present disclosure, a piezoelectric substrate is used to form the piezoelectric layer of the resonator, instead of using a conventional deposition method to form the piezoelectric layer, such that a piezoelectric substrate formed of a lithium niobate crystal or lithium tantalate having piezoelectric property can be used to form the piezoelectric layer of the bulk acoustic wave resonator, thereby improving the bandwidth and performance of the bulk acoustic wave resonator, and improving the performance of the formed filter. Meanwhile, the resonator carrier includes a boundary layer, a bonding layer, a periphery dielectric layer and a substrate, the boundary layer is located between the resonant structure and the bonding layer, and the boundary layer and the resonant structure encloses a cavity. Through defining the cavity by this structure, there is no need to form a cavity in a silicon substrate like traditional bulk acoustic wave resonator. As such, a completely insulating material other than silicon material can be flexibly chose for the carrier substrate, such that the issue of parasitic conductive channel generated due to the existence of carrier substrate silicon interface can be avoided, thereby improving the performance of the filter formed by the bulk acoustic wave resonator. In addition, the resonant carrier structure is formed through forming a trench in the dielectric layer, partially filling the trench with the boundary layer, and filling up the trench with the bonding layer, such that the boundary layer has a dual-wall structure in the trench, and the bonding layer is located on the boundary layer and fills up the trench, thereby having a larger contact area with the boundary layer, and the periphery dielectric layer laterally surrounds the protrusion parts of the boundary layer and the bonding layer that are located in the trench. Such a structure can improve the structural support strength of the resonant carrier, thereby improving the performance of the bulk acoustic wave resonator and the filter formed by the same.

The following aspects should be noted:

(1) The drawings of the embodiments of the present disclosure are merely related to the structures that are related to the embodiments of the present disclosure, while other structures may refer to the common design.

(2) The features in the same embodiment and different embodiments of the present disclosure may be combined with each other without conflict.

The above merely illustrates the specific embodiments of the disclosure, but the claimed scope of the disclosure is not limited thereto. Any variations or substitutions that may be readily achieved by person skilled in the art based on the scope of the disclosure should be included within the scope of the present disclosure. Therefore, the scope of the present disclosure should be subject to the scope of the claims.

The invention claimed is:

1. A method of manufacturing a bulk acoustic wave resonator, comprising:
    providing a first substrate and a piezoelectric substrate;
    bonding the piezoelectric substrate to the first substrate through a bonding layer;
    performing a thinning process on the piezoelectric substrate to form a piezoelectric layer having a desired thickness, thereby forming a piezoelectric substrate structure comprising the piezoelectric layer and the first substrate bonded to each other;
    forming a first electrode structure on the piezoelectric layer of the piezoelectric substrate structure, the first electrode structure is located on a first side of the piezoelectric layer away from the first substrate;
    forming a dielectric layer on the first electrode structure, and performing a patterning process on the dielectric layer to form a patterned dielectric layer comprising a sacrificial dielectric part and a periphery dielectric part separated from each other;
    forming a boundary layer on the patterned dielectric layer, the boundary layer covers a surface of the patterned dielectric layer and surrounds the sacrificial dielectric part;
    removing the first substrate and the bonding layer from the piezoelectric layer with the first electrode structure, the patterned dielectric layer, and the boundary layer, so as to expose a second side of the piezoelectric layer, the second side is opposite to the first side;
    forming a second electrode structure on the second side of the piezoelectric layer; and
    removing the sacrificial dielectric part to form a resonant cavity between the boundary layer and the piezoelectric layer and between the boundary layer and the first electrode structure.

2. The method of manufacturing the bulk acoustic wave resonator according to claim 1, wherein the first substrate is a semiconductor substrate, and the bonding layer is an insulating layer,
    wherein bonding the piezoelectric substrate to the first substrate through the bonding layer comprises:

forming a first bonding insulating layer on the first substrate;

forming a second bonding insulating layer on the piezoelectric substrate; and performing a bonding process, such that the first bonding insulating layer on the first substrate and the second bonding insulating layer on the piezoelectric substrate are bonded together to form the bonding layer.

3. The method of manufacturing the bulk acoustic wave resonator according to claim 1, wherein performing the thinning process on the piezoelectric substrate comprises:

performing a grinding process on the piezoelectric substrate from a side of the piezoelectric substrate away from the first substrate to remove a portion of the piezoelectric substrate.

4. The method of manufacturing the bulk acoustic wave resonator according to claim 1, further comprising:

performing an ion implantation process on the piezoelectric substrate to define a cleavage plane in the piezoelectric substrate, wherein performing the thinning process comprises: performing an annealing process on the piezoelectric substrate, such that the piezoelectric substrate is split along the cleavage plane; and performing a planarizing process on a remaining portion of the piezoelectric substrate adjacent to the bonding layer to form the piezoelectric layer.

5. The method of manufacturing the bulk acoustic wave resonator according to claim 1, wherein removing the first substrate and the bonding layer comprises performing a grinding process to remove the first substrate, and performing a grinding process and/or an etching process to remove the bonding layer.

6. The method of manufacturing the bulk acoustic wave resonator according to claim 1, wherein the first substrate comprises a glass carrier or a ceramic carrier having a release layer, and the bonding layer comprises at least one of an adhesive layer and a dielectric material layer, and the thinning process comprises a grinding process.

7. The method of manufacturing the bulk acoustic wave resonator according to claim 6, wherein removing the first substrate and the bonding layer comprises: irradiating a light on the release layer, such that the release layer is decomposed upon being irradiated by the light, and the first substrate is released from the piezoelectric layer; and performing at least one of a cleaning process and an etching process to remove the bonding layer.

8. The method of manufacturing the bulk acoustic wave resonator according to claim 6, wherein, before removing the first substrate and the bonding layer, the method further comprises: forming a bonding layer on the boundary layer, and bonding the second substrate on the bonding layer.

9. The method of manufacturing the bulk acoustic wave resonator according to claim 1, wherein the piezoelectric substrate satisfies at least one of the following conditions:

the piezoelectric substrate is formed by a crystal pulling process;

the piezoelectric substrate is a single crystal piezoelectric substrate;

the piezoelectric substrate has a thickness ranging from 200 μm to 400 μm; and the piezoelectric substrate comprises lithium niobate crystal and/or lithium tantalate crystal.

10. The method of manufacturing the bulk acoustic wave resonator according to claim 1, wherein performing the patterning process on the dielectric layer and forming the boundary layer on the patterned dielectric layer comprises:

removing a portion of the dielectric layer to form a trench in the dielectric layer, the trench separates the sacrificial dielectric part apart from the periphery dielectric part, and the trench surrounds the sacrificial dielectric part; and forming the boundary layer, the boundary layer fills into the trench and lines a surface of the trench, and is formed on a side of the sacrificial dielectric part away from the piezoelectric layer.

11. The method of manufacturing the bulk acoustic wave resonator according to claim 10, wherein before removing the first substrate and the bonding layer, the method further comprises:

forming a bonding layer on the boundary layer, the bonding layer fills a portion of the trench not filled by the boundary layer and is formed on a side of the patterned dielectric layer away from the piezoelectric layer; and bonding a carrier substrate on a side of the bonding layer away from the boundary layer.

12. The method of manufacturing the bulk acoustic wave resonator according to claim 11, wherein in the bulk acoustic wave resonator, the bonding layer and the boundary layer comprise protrusion parts protruding away from the carrier substrate and toward the piezoelectric layer in a direction perpendicular to a top surface of the carrier substrate, and the protrusion parts of the bonding layer and the boundary layer are located between the resonant cavity and the periphery dielectric part in the direction parallel to the top surface of the carrier substrate, and surrounds the resonant cavity.

13. The method of manufacturing the bulk acoustic wave resonator according to claim 12, wherein the protrusion parts comprise a first portion and a second portion with different protrusion heights.

14. The method of manufacturing the bulk acoustic wave resonator according to claim 1, wherein removing the sacrificial dielectric part to form the resonant cavity comprises:

performing a patterning process on the piezoelectric layer from the second side of the piezoelectric layer to remove a portion of the piezoelectric layer, and form a release hole penetrating through the piezoelectric layer and exposing the sacrificial dielectric part; and performing an etching process on the sacrificial dielectric part, wherein an etchant used in the etching process enters a region occupied by the sacrificial dielectric part through the release hole.

15. The method of manufacturing the bulk acoustic wave resonator according to claim 1, wherein forming the first electrode structure comprises:

forming a first electrode, an intermediate dielectric layer, a sacrificial layer and an edge protrusion structure, the intermediate dielectric layer is located on a side of the first electrode away from the piezoelectric layer, and the edge protrusion structure is disposed on edges of the intermediate dielectric layer and the first electrode and is on a side of the intermediate dielectric layer away from the piezoelectric layer, the sacrificial layer is sandwiched between the edge protrusion structure and the intermediate dielectric layer.

16. The method of manufacturing the bulk acoustic wave resonator according to claim 15, wherein the sacrificial dielectric part is removed by an etching process, and the etching process further removes the sacrificial layer, and a void is formed between the edge protrusion structure and the intermediate dielectric layer in the first electrode structure.

17. The method of manufacturing the bulk acoustic wave resonator according to claim 16, wherein the void is in spatial communication with the resonant cavity.

18. The method of manufacturing the bulk acoustic wave resonator according to claim 15, wherein forming the second electrode structure comprises:
- forming a second electrode and a passivation layer on the second electrode,
- wherein the first electrode of the first electrode structure comprises a first electrode lead-out part connected to an external connector, and a sidewall of the second electrode structure adjacent to the first electrode lead-out part is aligned with an inner edge of the edge protrusion structure of the first electrode structure.

19. The method of manufacturing the bulk acoustic wave resonator according to claim 1, further comprising:
- performing a patterning process on the piezoelectric layer to form a via hole extending through the piezoelectric layer and exposing a first electrode of the first electrode structure; and
- forming a connector passing through the via hole to be electrically connected to the first electrode.

20. The method of manufacturing the bulk acoustic wave resonator according to claim 19, wherein, during the patterning process performed on the piezoelectric layer, the method further comprises: simultaneously forming a release hole extending through the piezoelectric layer and exposing the sacrificial dielectric part.

* * * * *